(12) United States Patent  (10) Patent No.: US 7,253,465 B2
Yamamoto et al.  (45) Date of Patent: Aug. 7, 2007

(54) SEMICONDUCTOR INTEGRATED CIRCUIT DEVICE AND MANUFACTURING METHOD THEREOF

(75) Inventors: Naoki Yamamoto, Kawaguchi (JP); Yoshitaka Tadaki, Hanno (JP); Hiroshige Kogayu, Fussa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/817,004

(22) Filed: Apr. 5, 2004

(65) Prior Publication Data

US 2004/0211999 A1  Oct. 28, 2004

(30) Foreign Application Priority Data

Apr. 16, 2003 (JP) .............................. 2003-110997

(51) Int. Cl.
*H01L 29/76* (2006.01)
(52) U.S. Cl. ...................... 257/296; 257/301; 438/238; 438/243
(58) Field of Classification Search ...................... None
See application file for complete search history.

(56) References Cited

U.S. PATENT DOCUMENTS

| | | | |
|---|---|---|---|
| 5,907,188 A * | 5/1999 | Nakajima et al. | ............ 257/751 |
| 6,323,115 B1 | 11/2001 | Tanabe et al. | |
| 6,329,681 B1 * | 12/2001 | Nakamura et al. | .......... 257/297 |
| 6,552,400 B2 | 4/2003 | Tomita | |
| 6,875,679 B2 * | 4/2005 | Agarwal | ..................... 438/592 |
| 2001/0001209 A1 * | 5/2001 | Kunikiyo | ..................... 257/296 |
| 2001/0030342 A1 | 10/2001 | Ohnishi et al. | |
| 2004/0140502 A1 * | 7/2004 | Murata et al. | .............. 257/328 |

FOREIGN PATENT DOCUMENTS

| JP | 60-123060 | 12/1983 |
|---|---|---|
| JP | 61-152076 | 12/1984 |
| JP | 3-119763 | 10/1989 |

(Continued)

OTHER PUBLICATIONS

M. Tsukamoto et al., "0.25 μm W-Polycide Dual Gate and Buried Metal on Diffusion Layer (BMD) Technology for DRAM-Embedded Logic Devices", 1997 Symposium on VLSI Technology Digest of Technical Papers, pp. viii, 23-24.

(Continued)

*Primary Examiner*—Sue A. Purvis
*Assistant Examiner*—Ahmed N. Sefer
(74) *Attorney, Agent, or Firm*—Reed Smith LLP; Stanley P. Fisher, Esq.; Juan Carlos A. Marquez, Esq.

(57) ABSTRACT

In a dual polymetal gate electrode, the contact resistance at the interface of silicon films increases due to mutual-diffusion of impurities of p-type and n-type silicon films through a refractory metal and metal nitride deposited thereon. A way of inhibiting the phenomenon is carbon implantation into a refractory metal and refractory metal nitride on the boundary of p-type silicon and n-type silicon, cutting the path, or isolating it by an insulator. Thereby, mutual-diffusion of impurities through a refractory metallic film and nitride film of refractory metal is inhibited, resulting in an increase in the contact resistance of metal nitride film and silicon film and a decrease in the deviation of threshold voltage of the MISFET.

6 Claims, 22 Drawing Sheets

FOREIGN PATENT DOCUMENTS

| | | |
|---|---|---|
| JP | 6-5603 | 6/1992 |
| JP | 7-94716 | 9/1993 |
| JP | 8-264531 | 3/1995 |
| JP | 9-181194 | 12/1995 |
| JP | 9-289257 | 4/1996 |
| JP | 11-330468 | 5/1998 |
| JP | 2001-298186 | 4/2000 |
| JP | 2000-294562 | * 10/2000 |

OTHER PUBLICATIONS

K. Saino et al., "A Novel W/WNx/Dual-Gate CMOS Technology for Future High-Speed DRAM Having Enhanced Retention Time and Reliability", IEEE (2003), 4 pages.

* cited by examiner

SEMICONDUCTOR INTEGRATED CIRCUIT DEVICE AND MANUFACTURING METHOD THEREOF

CLAIM OF PRIORITY

The present application claims priority from Japanese application JP 2003-110997 filed on Apr. 16, 2003, the content of which is hereby incorporated by reference into this application.

FIELD OF THE INVENTION

This invention relates to the field of semiconductor integrated circuit devices and manufacturing methods of thereof, and more particularly to an improved method for a semiconductor integrated circuit device consisting a MISFET (Metal Insulator Semiconductor Field Effect Transistor) with a polymetal structure, wherein a gate electrode comprises polycrystalline silicon and a refractory metal.

BACKGROUND OF THE INVENTION

In prior art techniques, a polymetal gate structure has been used for lowering electrical resistance of a gate electrode, wherein a gate electrode structure comprises laminating a metal nitride film and a refractory metal film as a reaction protection film on polycrystalline silicon (for example, refer to patent documents 1, 2, 3, 4, and 5).

Moreover, in a layer structure of polycrystalline silicon/refraction protection film, which is metal nitride film/refractory metal layer, there is one example which describes a structure, wherein a metal silicide is inserted between a refraction protection layer and polycrystalline silicon because the contact resistance of a gate electrode becomes greater (for example, refer to patent document 6).

Furthermore, in a polymetal gate structure, one document describes an oxidation method to prevent a gate electrode from oxidation of the refractory metal and diffusion of boron in the polycrystalline silicon (for example, refer to patent document 7).

Moreover, in a dual gate electrode structure comprising p-type polycrystalline silicon and n-type polycrystalline silicon, especially in the case of a polycide gate structure comprising a laminate structure of tungsten silicide (a silicon compound of tungsten) on a p-type polycrystalline silicon and n-type polycrystalline silicon, boron existing in a p-type silicon region and phosphorus existing in a n-type silicon region diffuse mutually through a tungsten silicon compound (tungsten silicide) film formed on a polycrystalline silicon (for example, refer to non-patent document 1). One document describes a structure isolating a tungsten silicide layer to inhibit mutual-diffusion of impurities doped in the above-mentioned p-type polycrystalline silicon and n-type polycrystalline silicon (for example, refer to patent documents 8, 9, and 10). However, no document describes experimental data about mutual-diffusion of similar impurities in a polymetal gate structure without tungsten silicide and only small descriptions can be found in the above-mentioned Official Gazette.

One document describes a structure, wherein a second barrier metal film remains connected and a part of tungsten silicide of a first barrier metal film is isolated, to avoid the possibility that doped impurities diffuse mutually into polycrystalline silicon films of p-type regions and n-type regions through the tungsten silicide film similar to the above-mentioned polycide gate, in a polymetal gate comprising a laminate structure of a first barrier metal film; tungsten silicide/second barrier metal film; tungsten silicide/metal layer on a polycrystalline silicon film (for example, refer to non-patent document 11).

[Patent document 1] JP-A No. 123060/1985 (p2, FIG. 2)
[Patent document 2] JP-A No. 152076/1986 (p2, FIG. 1)
[Patent document 3] JP-A No. 119763/1991 (p3, FIG. 1)
[Patent document 4] JP-A No. 94716/1995 (p3, FIG. 1)
[Patent document 5] JP-A No. 264531/1996 (p3, FIG. 2)
[Patent document 6] JP-A No. 298186/2001 (3, FIG. 1)
[Patent document 7] JP-A No. 330468/1999 (p5, FIG. 11)
[Patent document 8] JP-A No. 5603/1994 (p3, FIG. 1)
[Patent document 9] JP-A No. 181194/1997 (p4, FIG. 1)
[Patent document 10] JP-A No. 289257/1997 (p5, FIG. 9)
[Patent document 11] JP-A No. 217311/2002 (p4, FIG. 2)

[Non-Patent Document]
0.25 μm W-Polycide Dual Gate and Buried Metal on Diffusion Layer (BMD) Technology for DRAM-Embedded Logic Devices, 1997 Symposium on VLSI Technology, Digest of Technical Papers pp.23-24, M. Tsukamoto, H. Kuroda, Y. Okamoto In a CMOSLSI, wherein a circuit comprises a fine MOSFET with a gate length of 0.18 μm or less, a DRAM and a memory-logic embedded DRAM, wherein a similar gate layer is used for the gate electrode and the circuit, a method of manufacturing a gate using low-resistance electrically conductive materials including a metal layer is thought to be employed to decrease gate delay and signal delay in the circuit and to ensure high-speed operation.

A most promising candidate for the low electrical resistance gate electrode material is a so-called polymetal comprising a laminated refractory metal film on a polycrystalline silicon film. A polymetal may be used not only for a gate electrode material but also for a wiring material because the sheet electrical resistance is as low as about 2Ω/□. As a refractory metal, W (tungsten) and Mo (molybdenum), etc. are used, which exhibit excellent low-resistance properties even in a low-temperature process below 800° C. as well as excellent electro-migration tolerance. Moreover, a practical polymetal gate comprises a trilayer structure, wherein a barrier layer consisting of metal nitride film such as $WN_x$ (tungsten nitride) is inserted between a polycrystalline silicon film and a refractory metal film, because the adhesive strength between the two films decreases or a high-resistance silicide layer is formed at the boundary of the two films during a high-temperature heat-treatment process when these refractory film is laminated directly on a polycrystalline silicon film. In this structure, because a $WN_x$ film is thought to have the ability to protect against diffusion of such impurities as phosphorus and boron in a polycrystalline silicon film into a metallic layer, it has been thought that the effects of multi-diffusion of impurities are not so significant between an n-channel region and a p-channel region through a metallic layer such as polycide gate.

However, from the results of evaluating mutual diffusion of impurities by a heat-treatment process using a sample comprising a trilayer structure, wherein a barrier layer of a metal nitride film such as a $WN_x$ (tungsten nitride) film was inserted between a polycrystalline silicon film and a refractory metal film, the inventors confirmed that phosphorus and boron of n-type and p-type polycrystalline silicon diffused mutually through the $WN_x$ film and the tungsten film formed thereon and that the ease of diffusion was similar to that of a polycide gate. In addition, experiments carried out by the inventors made it clear that the contact resistance between the polycrystalline silicon and these metals or metallic compounds increased due to diffusion of the impurities.

SUMMARY OF THE INVENTION

The purpose and features of the present invention to control these phenomena will become apparent in the following descriptions and accompanying drawings.

A brief description of a typical method describing the present invention is as follows:

A method of manufacturing a semiconductor integrated circuit device in the present invention comprises the following steps and includes a gate electrode manufactured by the above-mentioned method,
(a) forming a gate insulator on a substrate surface of a semiconductor wafer,
(b) forming a silicon layer on the above-mentioned gate electrode,
(c) doping n-type and p-type impurities into a pre-determined region of the above-mentioned silicon layer,
(d) forming a nitride film of a refractory metal on the above-mentioned impurity-doped silicon layer,
(e) forming a refractory metal film on the above-mentioned nitride film of refractory metal, and
(f) removing along the film thickness a part of the above-mentioned nitride film of refractory metal and refractory metal film deposited on the boundary region of n-type and p-type silicon layers, wherein impurity regions of n-type and p-type formed in the above-mentioned step (c) connect to the above-mentioned n-type and p-type impurity-doped silicon layers, and separate these films so that they are coplanar but discontinuous.

Moreover, a method of manufacturing a semiconductor integrated circuit device in the present invention includes the step, wherein the n-type and p-type parts are connected to each other by embedding a nitride of titanium, zirconium, or hafnium in a part formed in the above-mentioned step (f) separating the gate electrodes including n-type and p-type impurity-doped silicon layers, the nitride film of a refractory metal, and the refractory metal film, and includes a gate electrode manufactured thereby.

A method of manufacturing a semiconductor integrated circuit device in the present invention comprises the following steps and includes a gate electrode manufactured by the above-mentioned method,
(a) forming a gate insulator on a substrate surface of a semiconductor wafer,
(b) forming a silicon layer on the above-mentioned gate electrode,
(c) doping n-type and p-type impurities into a pre-determined region of the above-mentioned silicon layer,
(d) forming a silicide film of a refractory metal on the above-mentioned impurity-doped silicon layer,
(e) forming a nitride film of refractory metal on the above-mentioned silicide film of refractory metal,
(f) forming a refractory metal film on the above-mentioned nitride film of refractory metal, and
(g) removing along the film thickness a part of the above-mentioned silicide film of refractory metal, nitride film of refractory metal, refractory metal film, and the above-mentioned n-type and p-type impurity-doped silicon layer deposited on the boundary region of n-type and p-type silicon layers, wherein impurity regions of n-type and p-type formed in the above-mentioned step (c) are connected to each other, and separate these films so that they are coplanar but discontinuous.

Moreover, a method of manufacturing a semiconductor integrated circuit device in the present invention includes the step, wherein the n-type and p-type parts are connected to each other by embedding a nitride of titanium, zirconium, or hafnium in a part formed in the above-mentioned step (g) separating the n-type and p-type gate electrodes including impurity-doped silicon layers, the silicide film of a refractory metal, the nitride of refractory metal, and the refractory metal film, and includes a gate electrode manufactured thereby.

Additionally, a method of manufacturing a semiconductor integrated circuit device in the present invention comprises the following steps and includes a gate electrode manufactured by the above-mentioned method,
(a) forming a gate insulator on a substrate surface of a semiconductor wafer,
(b) forming a silicon layer on the above-mentioned gate electrode,
(c) doping n-type and p-type impurities into a pre-determined region of the above-mentioned silicon layer,
(d) forming a silicide film of a refractory metal on the above-mentioned impurity-doped silicon layer,
(e) forming a nitride film of refractory metal on the above-mentioned silicide film of refractory metal,
(f) forming a refractory metal film on the above-mentioned nitride film of refractory metal, and
(g) injecting carbon, nitrogen or oxygen to a part or all parts along the film thickness of the above-mentioned silicide film of refractory metal, nitride film of refractory metal, refractory metal film, and the above-mentioned n-type and p-type impurity-doped silicon layer deposited on the boundary region of silicon layers, wherein impurity regions of n-type and p-type formed in the above-mentioned step (c) are connected to each other.

Moreover, a method of manufacturing a semiconductor integrated circuit device in present invention comprises the following steps and includes a gate electrode manufactured by the above-mentioned method,
(a) forming a gate insulator on a substrate surface of a semiconductor wafer,
(b) forming a silicon layer on the above-mentioned gate electrode,
(c) doping n-type and p-type impurities into a pre-determined region of the above-mentioned silicon layer,
(d) forming a non-doped silicon film and SiGe film on the above-mentioned impurity-doped silicon layer,
(e) forming a nitride film of refractory metal on the above-mentioned non-doped silicon film or SiGe film, and
(f) forming a refractory metal film on the above-mentioned nitride film of refractory metal.

Furthermore, a method of manufacturing a semiconductor integrated circuit device in the present invention comprises the following steps and includes a gate electrode manufactured by the above-mentioned method,
(a) forming a gate insulator on a substrate surface of a semiconductor wafer,
(b) forming a silicon layer on the above-mentioned gate electrode,
(c) doping n-type and p-type impurities into a pre-determined region of the above-mentioned silicon layer,
(d) forming a non-doped silicon film and SiGe film on the above-mentioned impurity-doped silicon layer,
(e) forming a layer including oxygen, nitrogen and carbon at the boundary of the above-mentioned impurity-doped silicon layer and the above-mentioned non-doped silicon layer or SiGe film, (f) forming a nitride film of refractory metal on the above-mentioned non-doped silicon layer or SiGe layer, and (g) forming a refractory metal film on the above-mentioned nitride film of refractory metal.

Additionally, a method of manufacturing a semiconductor integrated circuit device in the present invention comprises the following steps and includes a gate electrode manufactured by the above-mentioned method, (a) forming a gate insulator on a substrate surface of a semiconductor wafer, (b) forming a silicon layer on the above-mentioned gate electrode, (c) doping n-type and p-type impurities into a pre-determined region of the above-mentioned silicon layer, (d) forming a non-doped silicon film and SiGe film on the above-mentioned impurity-doped silicon layer, (e) forming a layer including oxygen, nitrogen and carbon at the boundary of the above-mentioned impurity-doped silicon layer and the above-mentioned non-doped silicon layer or SiGe film, (f) forming a nitride film of refractory metal on the above-mentioned non-doped silicon layer or SiGe layer, (g) forming a refractory metal film on the above-mentioned nitride film of refractory metal, and (h) introducing additional impurities to the above-mentioned impurity-doped silicon layer through the above-mentioned refractory metal.

DETAILED DESCRIPTION OF THE INVENTION

Figure 1A:
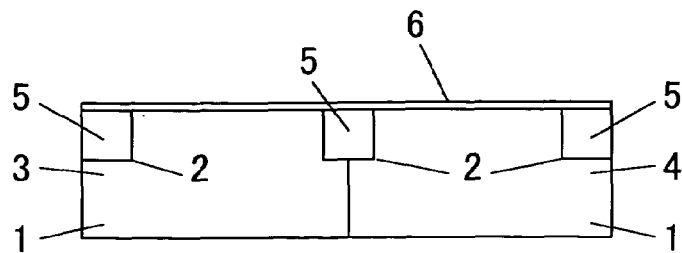
FIGS. 1A to 1E are schematic cross-sectional views of main parts of each process step illustrating a manufacturing process according to the first embodiment being an embodiment of this invention.
Figure 1B:
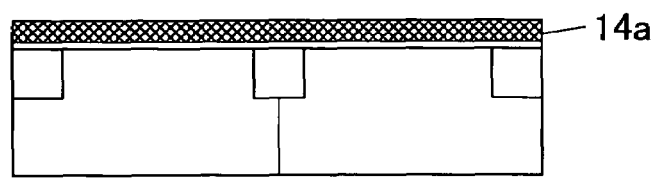

This invention will be described in detail by way of embodiments with reference to the accompanying drawings. In all the drawings used to describe the embodiments, all parts having the same function are shown as a single symbol to avoid repeating the explanation. Moreover, in the following embodiments, the description of same or similar parts is not repeated as a rule, except when it is especially necessary.

Furthermore, the following embodiments will be described by dividing in multiple sections or by embodiments when it is necessary for convenience, but, except where especially indicated, they are not mutually independent, but mutually related as a modification of one another, a detailed description, and a supplementary description.

Additionally, in the following embodiments, where a number of a factor is referred to, it is to be understood that the invention is not intended to be limited to the specific number, except when especially specifying and the number is principally and obviously limited to the specific number. Moreover, in the following embodiments, it is to be understood that the elements (including element steps etc.) of this invention do not always require all processes, except when especially indicated and considered to be in principle obviously necessary.

Similarly, in the following embodiments, when the structure of an element and a relationship of positions are described, it is to be understood that the invention is not intended to be limited to that structure and relationship of positions, except when especially indicated and considered in principle not to be obviously so.

Semiconductor integrated circuit device wafer or semiconductor wafer as used herein means a silicon single crystalline substrate (in general, nearly circular), a sapphire substrate, glass substrate, other insulators, semi-insulator or semi-conductor substrate, and a composite substrate thereof. "Semiconductor integrated circuit device" (or "electric device", "electrical circuit device") as used herein means not only one formed on a single crystalline substrate, but also one formed on the above-mentioned substrates, an SOI (Silicon on Insulator) substrate, a TFT (Thin Film Transistor) substrate for liquid crystals, an STN (Super Twisted Nematic) substrate for liquid crystals, unless otherwise stated.

Materials and gas compositions used herein mean not only pure ones but also materials, wherein the material is included as a main element and other added elements are allowed, except when especially indicated. For instance, a gas composition used herein means a main reaction gas and treatment gas, and an additional gas with a side-effect, dilution gas and auxiliary gas may be also accepted as an addition.

Silicon oxide film as used herein means in general a variety of silicon base oxide films including various added elements and auxiliary elements, that is one single film or a composite film selected from PSG (phospho Silicate Glass) film, BPSG (Boro-Phospho Silicate Glass) film, TEOS (Tetra-Ethoxy Silane) oxide film, and silicon oxynitride film, unless otherwise stated.

Moreover, silicon nitride as used herein means not only $Si_3N_4$ but also insulators with a similar composition in the family of silicon nitrides.

Gate oxide films may include not only a silicon thermal oxidation film and silicon oxynitride, but also thermal oxidation films of other elements, deposited films, and coated films, wherein the material includes a dielectric nitride or a composite film thereof, such as non-silicon base metallic oxide and silicon nitride except a silicon oxide film.

Moreover, "silicon" and "silicon base" as used herein concerning materials of conductive regions of a substrate surface or deposited film may include not only relatively pure silicon, but also silicon containing impurities and additives and conductive materials consisting of silicon as a main element, except when especially specified. (For example, SiGe alloy is included, wherein the content of Ge is greater than 50% in a silicon base alloy. Another example is that of a polycrystalline silicon gate and channel region switched to SiGe.) Furthermore, these materials may have a high electrical resistance as-deposited, to the extent that they are not technically incompatible.

A deposited film, wherein it is amorphous as-deposited but crystallized right after a heat-treatment, is described in a later format from the beginning to avoid inconsistent descriptions, except when especially necessary. For instance, polycrystalline silicon is in an amorphous state as-deposited, but changes to a polycrystalline state by heat-treatment. However, polycrystalline silicon can also be used from the beginning. Namely, when polycrystalline silicon is used, the amorphous state as-deposited provides the advantages of inhibiting channeling of injected ions, avoiding processing difficulties caused by granular shapes while etching, and keeping the sheet electrical resistance low after heat-treatment.

Figures 4A, 4B, 4C:
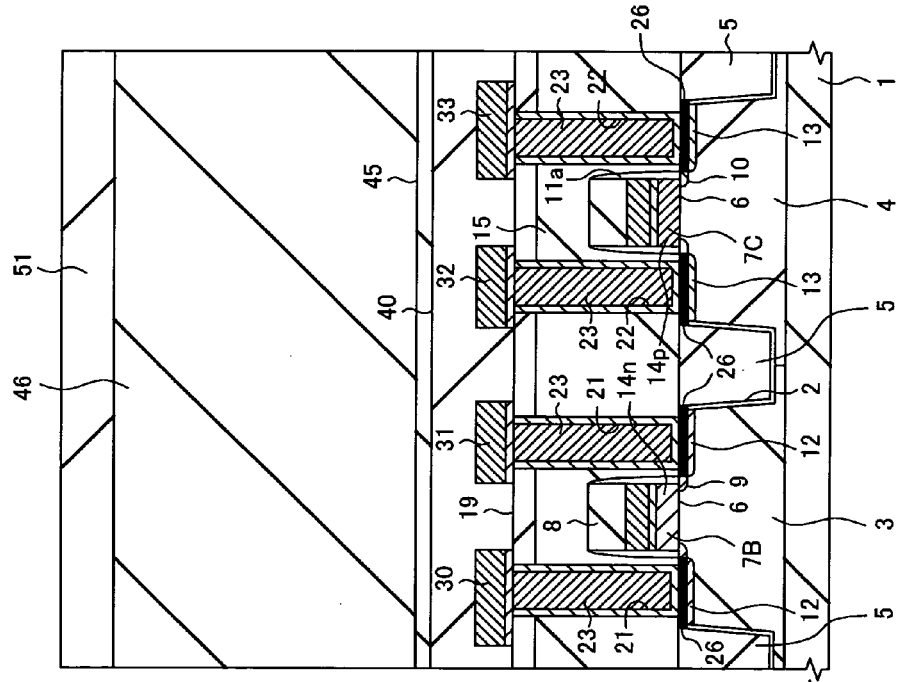
FIG. 4 is a schematic cross-section of a main part of a memory logic embedded semiconductor device according to an embodiment of this invention.

An embodiment of a semiconductor integrated circuit device in the present invention is DRAM (Dynamic Random Access Memory) or a memory-logic embedded semiconductor device. FIG. 4 shows a cross-section of a memory-logic embedded semiconductor device as a typical example of a semiconductor integrated circuit device in the present invention.

Part (A) in the left-hand side of the figure is a cross-section of a memory array (cell), part (B) in the center is a bit line BL region of memory, and part (C) in the right-hand side is a cross-section showing a part of a logic circuit.

For example, trenches for isolation 2, p-type wells 3 and n-type wells 4 are formed on the main surface of a semi-conductor substrate consisting of p-type single crystalline silicon (hereinafter, it is called a substrate or may be called a semiconductor wafer or just wafer) 1. On the p-type well of a memory array, multiple memory cells are formed, which comprise n-channel type memory selector MISFET (Metal Insulator Semiconductor Field Effect Transistor) Qt and memory capacitance C formed thereon.

Memory selector MISFET Qt mainly comprises the gate insulator 6, gate electrode 7A, which consists of word line WL in a region except for an active region, and a pair of n-type semiconductor regions (source and drain) 9. Gate electrode 7A (word line WL) comprised, for example, a so-called polymetal structure laminating $WN_x$ (tungsten nitride) film 24 and W film 25 on the top of P (phosphorus)-doped n-type polycrystalline silicon film 14n. $MoN_x$ (molybdenum nitride) film 24 and Mo film 25 may be used in lieu of $MN_x$ film and W film.

The part of logic circuit comprises a so-called complementary MIS circuit, wherein multiple n-channel type MISFETs and multiple p-channel type MISFETs are combined. N-channel type MISFET is formed on the p-type well 3 and mainly comprises gate insulator 6, gate electrode 7B and a pair of $n^+$-type semiconductor regions (source and drain) 12. Moreover, p-channel type MISFET is formed on the p-type well 4 and mainly comprises gate electrode 7C and a pair of p+-type semiconductor regions (source and drain) 13. On the source and drain surfaces of these logic circuits, silicide films of cobalt compound are formed. Gate electrodes 7A and 7C comprise polymetal structured conductive films which are the same as the gate electrode 7A of the above-mentioned memory selector MISFET Qt. However, phosphorus is contained in the polycrystalline silicon 14n of the gate electrode 7B as an n-type impurity, and boron is contained in the polycrystalline silicon 14p of the gate electrode 7C as an n-type impurity. Moreover, the silicon nitride film 8 is formed on the top of these gate electrodes and side-wall spacer 11s consisting of silicon nitride film is formed along the wall.

Silicon nitride film 8 on the top of the gate electrode 7A (word line WL) of memory selector MISFET Qt and silicon nitride film 11 covering the walls are formed, and then the insulating interlayer 15 is formed on the silicon nitride films of gate electrodes 7A, 7B and 7C. The insulating interlayer 15 comprises two layers of silicon oxide film consisting of, for example, a Spin on Glass film, which is a silicon oxide insulator formed by a coating method, and another film thereon.

On the top of a pair of n-type semiconductor regions 9 comprising the source and drain of memory selector MISFET Qt, contact holes 16 and 17 are formed, opening through the insulating interlayer 15 and under the silicon nitride layer 11. Plug 18, for example, comprising phosphorus-doped n-type polycrystalline silicon film, is embedded inside these contact holes 16 and 17.

Silicon oxide film 19 is formed on the top of insulating interlayer 15 and through holes of 20 are formed in the upper silicon oxide film 19 of one of the above-mentioned pair of contact holes 16 and 17 (contact hole 16). The through hole 20 is located on the upper part of the trench for isolation 2, which is out of the active region, and plug 2 comprising two layers of conductive films, wherein, for example, a W film is laminated on top of a TiN (titanium nitride) film, is embedded in the through hole. Plug 23 embedded into the through hole 20 is electrically connected with one of the source and drain of memory selector MISFET Qt (n-type semiconductor region 9 shared by two memory selector MISFET Qt) through the plug 18 embedded in the bottom contact hole 16.

Contact holes 21 and 22 are formed in the silicon oxide film 19 and underlying insulating interlayer 15 of the logic circuit region. The contact hole 21 is formed in the upper part of a pair of n+-type semiconductor regions (source and drain) 12 consisting of source and drain of an n-channel type MISFET, and the contact hole 22 is formed in the upper part of a pair of $p^+$-type semiconductor regions (source and drain) 13 consisting of source and drain of p-channel type MISFET. Inside these contact holes 21 and 22, the plug 23 is embedded, which comprises the same material as the plug 23 embedded in the through hole 20 of the above-mentioned memory array.

The multiply bit lines BL, which read data of the memory cell, are formed on the top of the silicon oxide 19 of the memory array. These bit lines BL are placed on the upper part of the isolation trench 2 and expanded to the direction intersecting at right angles with the gate electrode 7A (word line WL) with the same width and same gap. Each of bit line BL is connected with one of the source and drain of memory selector MISFET Qt (n-type semiconductor region 9) through the plug 23 in the through hole 20 and the plug 18 in the lower contact hole 16, which are formed in the lower silicon oxide film 19. For example, the bit line BL comprises a conductive layer laminating W film on top of the $WN_x$ film.

On the top of the silicon oxide film 19 of the logic circuit region, the first layer wirings 30-33 are formed. These wirings 30-33 comprise the same conductive layer as the bit line BL, and it is formed at the same time as the bit line BL. The wirings 30-33 are connected with the source and drain of n-channel type memory selector MISFET ($n^+$-type conductive region 12) through the plug 23 in the contact hole 21 formed in the silicon oxide film 19 and 15. And wirings 32-33 are connected with the source and drain of p-channel type memory selector MISFET ($p^+$-type semiconductor region 13) through the plug 23 in the contact hole 22 formed in the silicon oxide film 19 and 15.

On the top of the bit line BL and the wirings 30-33 of the first layer, the insulating interlayer 40 is formed. The insulating interlayer 40 comprises two layers of silicon oxide film consisting of a spin-on-glass film and another film thereon, and the surface of the film is controlled to be planarized with almost the same level.

The through hole 43 is formed in the insulating interlayer 40 and the lower silicon oxide layer 19 of the memory array. The through hole 43 is located on the top right of the lower contact hole 17, and plug 44 consisting of, for example, phosphorus doped n-type polycrystalline silicon film, is embedded therein.

The silicon oxide film 45 and the thicker silicon oxide film 46 are formed on the top of the insulating interlayer film 40, and the memory capacitance C comprising bottom electrode 48, capacitor insulator 49 and the upper electrode 50 are formed inside the deep trench 47 formed in the silicon oxide film 46. The bottom electrode 48 of the memory capacitance C comprises, for example, phosphorus-doped low electrical resistance n-type polycrystalline silicon film, and is electrically connected with one of the n-type semiconductor regions (source and drain) of memory selector MISFETQt through the above-mentioned through hole 43 and contact hole 17 formed underneath the bottom electrode. Moreover, the capacitor insulator 49 and the top electrode 50 of the memory capacitance C comprise, for example, $Ta_2O_5$ (tantalum oxide) film and TiN film, respectively.

The silicon oxide film 51 is formed on the top of the memory capacitance C and about two layers of Al wiring are formed thereon, but a drawing of them has been omitted.

Figure 5:
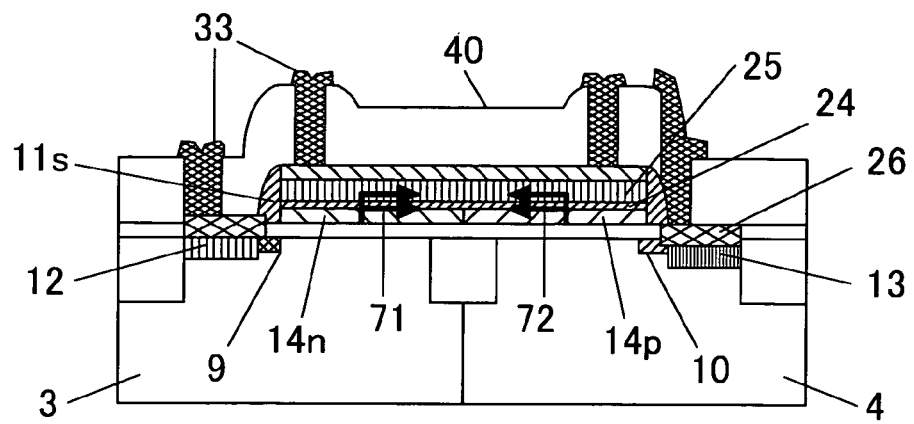
FIG. 5 is a schematic drawing to explain mutual-diffusion of impurities at a connecting part of a complementary MIS circuit, comprising a gate electrode and wiring having p-type silicon film and a gate electrode and wiring having n-type silicon film, according to an embodiment of this invention.

What is described above is a basic structure of a memory-logic embedded semiconductor device in this invention, and the effects of this invention will appear in a logic circuit area and at a peripheral circuit area of a memory array of DRAM memory. These circuit areas comprise a complementary MIS circuit, and an n-channel type MISFET and p-channel type MISFET may be connected to each other with each gate electrode sharing one polymetal gate electrode, as shown in FIG. 5. In this case, the polycrystalline silicon region of phosphorus-doped polymetal gate and boron-doped polycrystalline silicon regions are connected on the isolation region located between the active regions of each MISFET. In the case of such a structure, impurities such as phosphorus and boron doped in the polycrystalline silicon diffuse into the opposite channel region (71 and 72) through the upper $WN_x$ film 24 or W film 25, therefore the contact resistance between the $WN_x$ layer and polycrystalline silicon layer 14n, 14p drastically increases. These phenomena prevent the complementary MISFET circuit from driving at high-speed. As it becomes necessary for elements in the integrated circuit to develop finer planar dimensions to increase the degree of integration with developing semiconductor circuit devices, the distance to the opposite channel region of a complementary MISFET circuit shown in FIG. 5 becomes smaller, thereby increasing the amount of diffused impurities through the above-mentioned metal layer. In an extreme case, impurities diffused from the opposite channel region reach the interface of the gate oxide film in the polycrystalline silicon and decrease the effective impurity concentration at the interface, resulting in a fluctuating threshold voltage of the MOS transistor.

Figure 6:
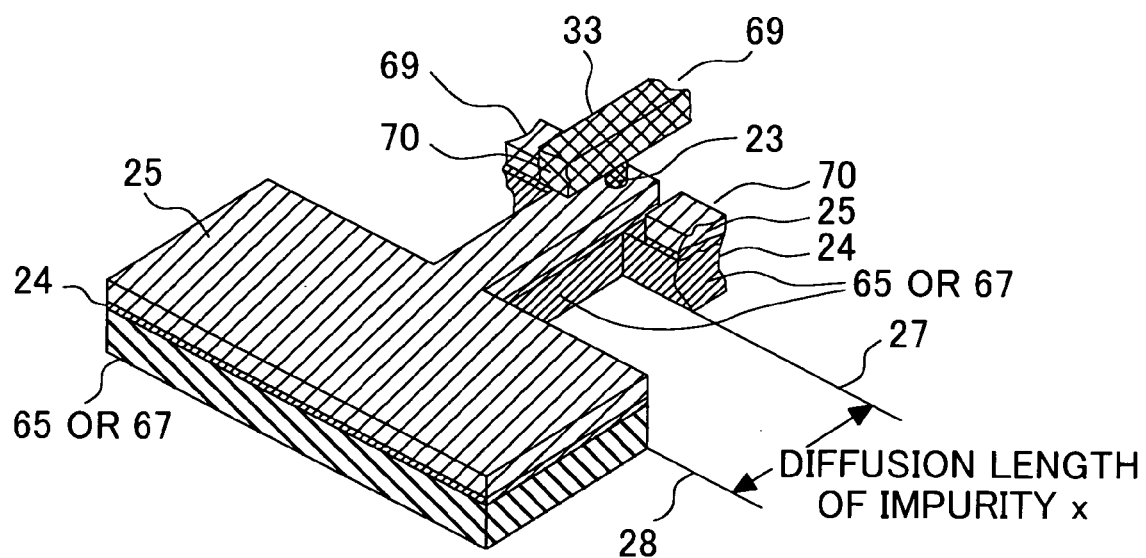
FIG. 6 is a device for analyzing impurity mutual-diffusion in an embodiment of this invention.
Figure 7A:
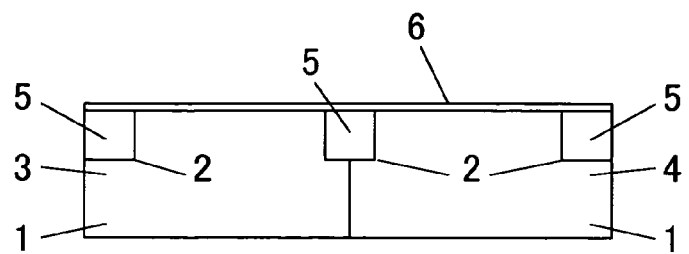
FIGS. 7A to 7E are schematic cross-sections of main parts of an application example in an embodiment, according to the second embodiment being an embodiment of this invention.
Figure 7B:
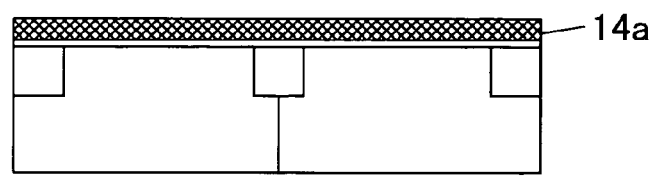
Figure 7C:
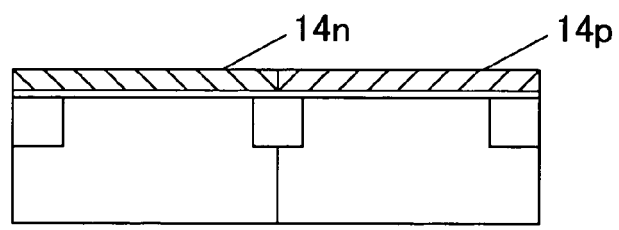
Figure 7D:
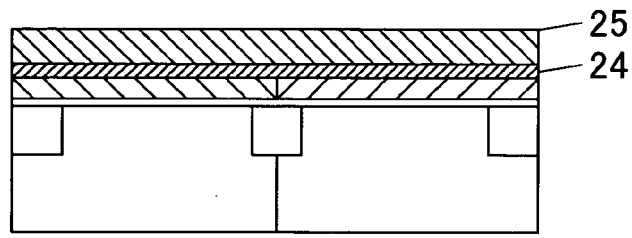
Figure 7E:
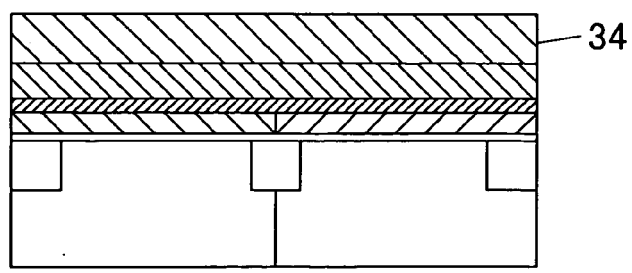

The above phenomena appeared in a memory-logic embedded semiconductor device. In the following example is described an objective of the present invention which is related to the inhibition or cessation of mutual-diffusion of impurities. The effects of each embodiment of this invention evaluated using the device for analyzing impurity mutual-diffusion are shown in FIG. 6. In this device, the contact resistance between the metal compound layer and the polycrystalline silicon layer is evaluated by Kelvin bridge resistive elements and the diffusion source of opposite impurities. That is, the mutual-diffusion of impurities was evaluated from the dependency of the contact resistance to distance x between measurement position 27 of contact resistance of the Kelvin resistive elements and the edge of the opposite impurity diffusion source region 28 in the silicon layer.

FIRST EMBODIMENT

This embodiment will be described with reference to FIG. 1. The purpose of each example written hereinafter is for the manufacture of the analysis device shown in FIG. 6. However, the manufacturing condition of each layer is that for manufacturing a memory logic embedded semiconductor device described in FIG. 4 and the experimental parameters such as heat treatment condition are obviously selected to cover the whole process condition of the above-mentioned embedded semiconductor device.

First, as shown in FIG. 1, isolation trenches are formed on the main surface of a prepared substrate (wafer) comprising p-type single crystalline silicon, and ions of B (boron) and P (phosphorus) are injected into one and another region of substrate 1, respectively. Then, substrate 1 is heat-treated at approx. 950° C. for about 10 minutes to diffuse theses impurity elements, forming a p-well 3 and n-well 4. Forming the isolation trench 2 is carried out, for example, by etching the isolation trench region of substrate 1 to form a trench with about 350 nm in depth, and a silicon oxide film is deposited by a CVD (Chemical Vapor Deposition) method inside the trench and on the surface of the substrate 1, and then the waste silicon oxide film outside of the trench is removed by chemical mechanical polishing (CMP) method. The above description is a method wherein the silicon oxide 5 is embedded in the isolation trench. As a result, multiple regions having an island pattern are formed, wherein well regions are surrounded by the isolation trenches 2.

Next, after cleaning the surface of substrate 1 by hydrofluoric acid, the substrate 1 is oxidized by steaming to form a clean gate insulator 6 consisting of silicon oxide on the surface of p-type well 3 and n-type well 4. The film thickness of the gate insulator 6 is, for example, 4 nm. The gate insulator 6 may consist of silicon oxynitride film, silicon nitride film, a composite film of silicon oxide and silicon nitride (FIG. 1A).

Figure 1C:
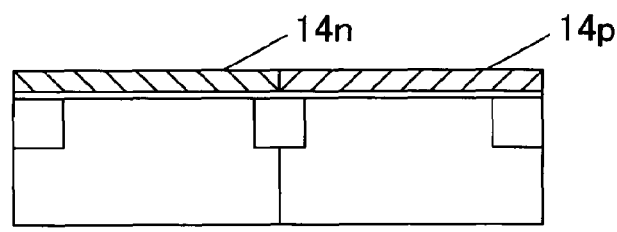

Then, an amorphous silicon film 14$a$ with, for example, 70 nm in thickness is deposited on the top of the gate insulator 6 by a CVD method (the deposition temperature=about 630° C.) using, for example, monosilane (SiH$_4$) as a source gas (FIG. 1B) The n-well region is covered with a photo-resist film using a conventional photolithography technique. Using the resist as a mask, phosphorus irons are implanted into the amorphous silicon film in the p-type well region using an ion implantation technique to form the n-type impurity-doped silicon film region 14$n$. The ion implantation condition is set at dosage $2 \times 10^{15}/cm^2$ at 10 keV, for example. Using the same technique, boron irons are implanted into the amorphous silicon film in the n-type well region to form the p-type silicon film region 14$p$ with a dosing condition, for example, of dosage $2 \times 10^{15}/cm^2$ at 5 keV. Then, it is heat-treated by a ramp-anneal (rapid heat-treatment) at 950° C. for 10 seconds in nitrogen atmosphere to electrically activate these doped impurities (FIG. 1C).

Figure 1D:
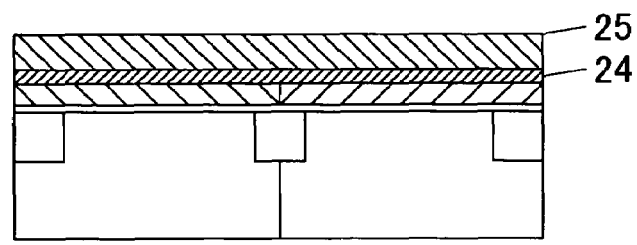
Figure 1E:
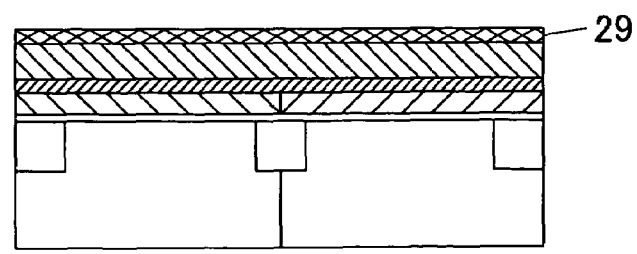
Figure 2A:
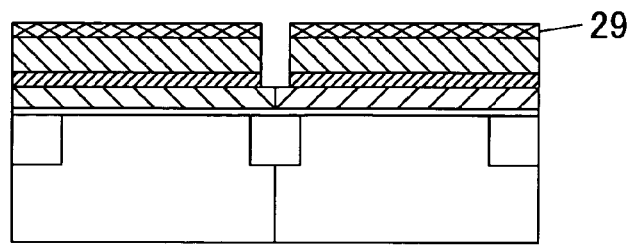
FIGS. 2A to 2D are schematic cross-sectional views of main parts of each process step illustrating a manufacturing process according to the first embodiment being an embodiment of this invention.

Then, about a 7 nm thick WN$_x$ film 24 and 70 nm thick W film 25 are continuously deposited (FIG. 1D) on the top of these silicon film regions 14$n$ and 14$p$ using a sputtering method, and subsequently an approximately 30 nm thick silicon nitride film 29 is deposited (FIG. 1E) on the top of the W film 25 using a plasma CVD method at the deposition temperature of, for example, 480° C. After that, using photolithography and dry-etching techniques, the silicon nitride film 29 is locally removed, which is located at the boundary connecting n-type and p-type impurity regions in the above-mentioned amorphous silicon film. Then, using the silicon nitride 29 as a dry-etching mask, WN$_x$ film 24 and W film 25 located at the region connecting n-type impurity and p-type impurity are removed (FIG. 2A). These processes provide blockage of a path for mutual-diffusion of impurities through the WN$_x$ film 24 and W film 25.

Figure 2B:
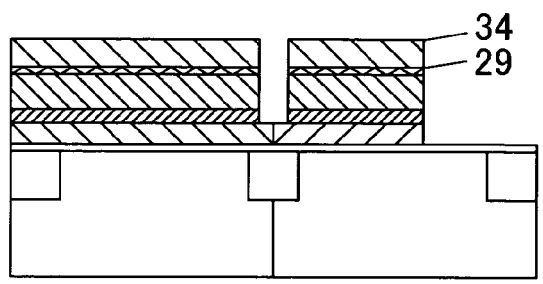
Figure 2C:
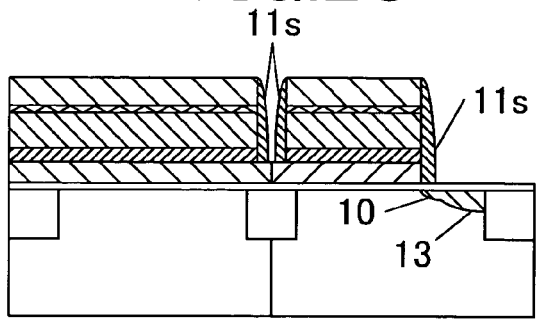
Figure 2D:
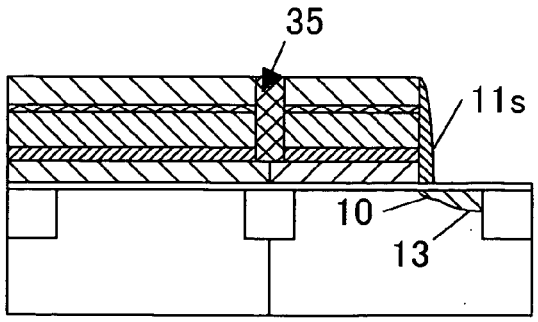

Next, after depositing a 120 nm thick silicon nitride film 34 using a CVD method at, for example, 480° C., the silicon nitride film is processed into a desired pattern using a previously described manufacturing method. Then, using the silicon nitride 34 as a mask, WN$_x$ film 24, W film 25, silicon film 14$n$ and 14$p$ are dry-etched to form the gate electrode and wiring patterns (FIG. 2B). Subsequently, a 50 nm thick silicon nitride film is deposited by the above-mentioned plasma CVD method, and the side-wall spacer 11$s$ is deposited along the side wall of the gate electrode, the pattern of which is formed by etching the silicon nitride film using an anisotropic plasma etching technique (FIG. 2C). Titanium nitride 35 may be embedded into the isolated trench to connect the isolating WN$_x$ film 24, W film 25 (FIG. 2D).

Figure 3A:
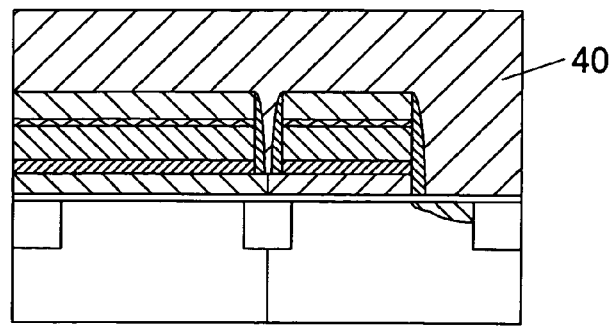
FIGS. 3A to 3C are schematic cross-sectional views of main parts of each process step illustrating a manufacturing process according to the first embodiment being an embodiment of this invention.
Figure 3B:
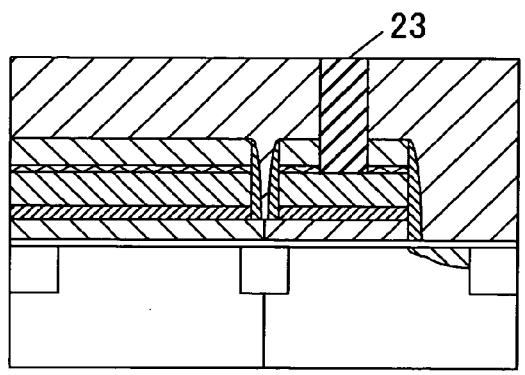
Figure 3C:
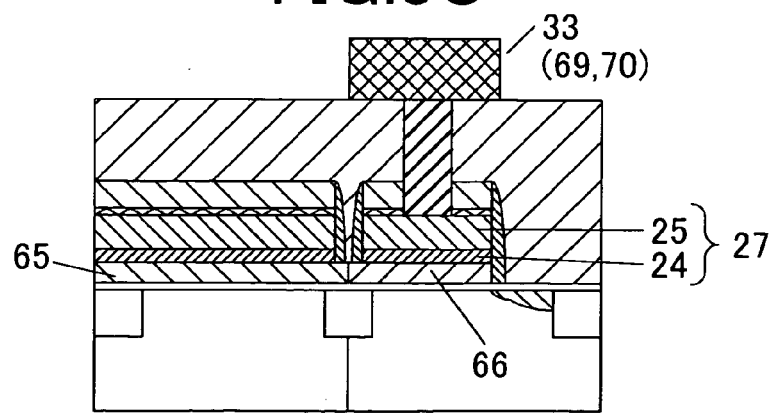
Figure 22A:
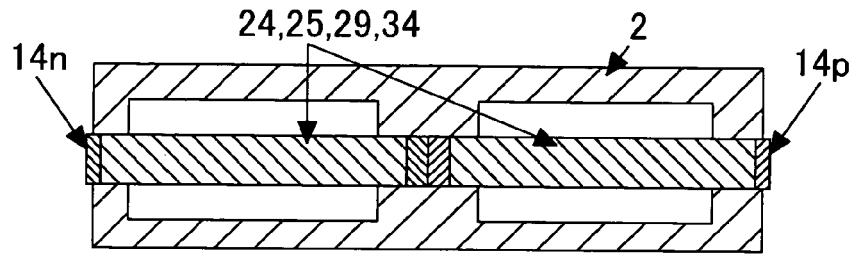
FIGS. 22A to 22D are top plain views of the first, third, fourth, and fifth embodiments.

Heat treatment was carried out in a condition which includes a range of thermal process conditions employed in a manufacturing process of a memory logic embedded semiconductor device. In this heat-treatment, heat-treatment temperature, time, and atmosphere are selected as parameters. After the heat-treatment, a silicon oxide film with 400 nm in thickness is deposited as the insulating interlayer 40 by a CVD method (FIG. 3A). Next, a contact hole is opened in the above-mentioned silicon film by a dry-etching method to make electrical conductivity, and then it is filled with Ti/TiN/W complex to form the contact plug 23, which is used in a conventional semiconductor device (FIG. 3B). Moreover, wiring 33 comprising a multi-layer structure of the W film 69 formed by a sputtering method and the W film 70 formed by a CVD method is deposited on the insulating interlayer 40 (FIG. 3C). The top plan view is shown in FIG. 22A.

Using the device shown in FIG. 6 manufactured as described above, the contact resistance was evaluated. Manufactured in this manner, several devices which had different impurity diffusion lengths x were prepared on one chip. In a memory logic embedded semiconductor device, there is an isolation region 2 at a boundary of p-well 3 and n-well 4, and the connecting part of the gate electrode of silicon layer 14$n$ and 14$p$ is often placed on the oxide layer 5 embedding the trench in this region.

Moreover, in order to confirm the efficacy of the present invention, a device was manufactured as a reference, wherein W film 25 and WN$_x$ film 24 on the connecting region of p-type and n-type in the silicon film was not removed. This is a conventional device involving a diffusion path of impurities which presented a problem.

After describing the following embodiments, the effects of the present example will be described while comparing them in their entirety.

SECOND EMBODIMENT

Figure 8A:
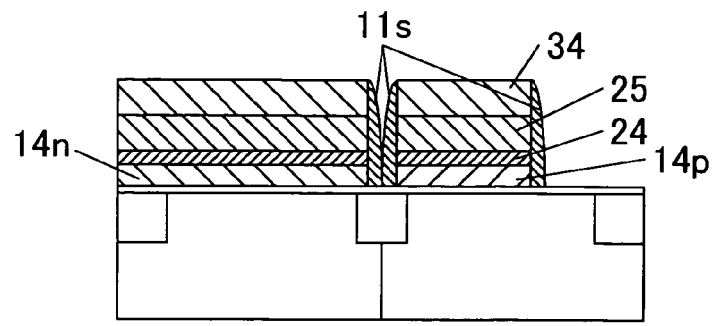
FIGS. 8A to 8D are schematic cross-sections of main parts of an application example in an embodiment, according to the second embodiment being an embodiment of this invention.

This embodiment will be described with reference to FIG. 7. FIGS. 7A to 7D are the same steps described in FIRST EMBODIMENT, but a difference in this embodiment is that silicon 14$n$ and 14$p$ are removed with the W film 25 and WN$_x$ film 24 located on the boundary connecting n-type impurity and p-type impurity. In this case, the steps described in the first embodiment are omitted, wherein the W film 25 and $WN_x$ film 24 are located on the boundary connecting n-type impurity and p-type impurity in the amorphous silicon film using the approximately 30 nm thick silicon nitride film 29 as a dry-etching mask (FIG. 2A). In lieu of these steps, the 120 nm thick silicon nitride film 34 was formed by a CVD method at, for example, 480° C. (FIG. 7E) and W film 25 and $WN_x$ film 24 located on the above-mentioned connecting boundary, and silicon film 14n and 14p were removed at the same time when the gate electrode and wiring patterns were processed using the silicon nitride as a mask. As a result, because n-type region and p-type region are completely isolated, electrical conductivity between both regions disappears. In the next step, the spacer 11s consisting of silicon nitride film is formed as described in FIRST EMBODIMENT (FIG. 8A).

There is a way to connect the n-type and p-type regions, comprising the following steps:

forming an insulating interlayer on them, opening a contact hole connecting the tungsten layer 25 on the n-type and p-type regions, and connecting the n-type and p-type regions by a wiring layer placed on the insulating interlayer.

However, this process is necessary to keep a space to match the positions of the gate electrode, wiring pattern, contact hole pattern and the top wiring pattern, so that it will be an obstacle to highly integrate a semiconductor integrated circuit device.

Figure 8B:
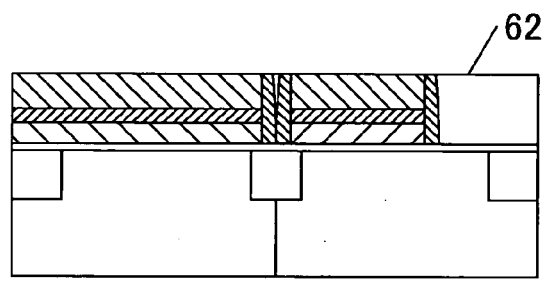

Therefore, after removing the W film 25 and $WM_x$ film 24 of the connecting part, and the silicon film 14n and 14p, the spacer 11s was formed and the silicon oxide film 63 was deposited on the whole surface of the substrate using plasma CVD at 420° C. After that, the gate electrode, the silicon oxide film 62 formed on the flat part of the wiring pattern, and the silicon nitride film 34 were removed by a chemical mechanical polishing (CMP) method to expose the W film 25 lying underneath the gate electrode and upper silicon nitride film, thereby the above-mentioned silicon oxide remains only at the trench part located at the boundary of p-type and n-type regions (FIG. 8B) Because the above-mentioned silicon oxide film 62 remains after the CMP process on the concave part, except for the gate electrode and wiring region, the whole surface of the sample becomes flat.

Figure 8C:
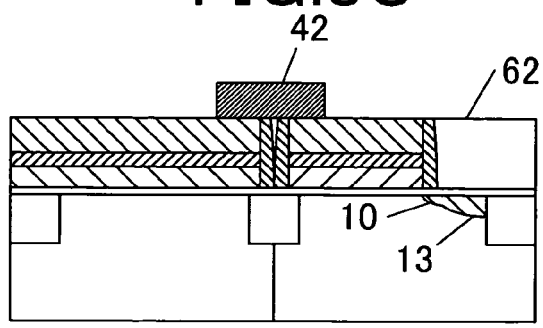
Figure 8D:
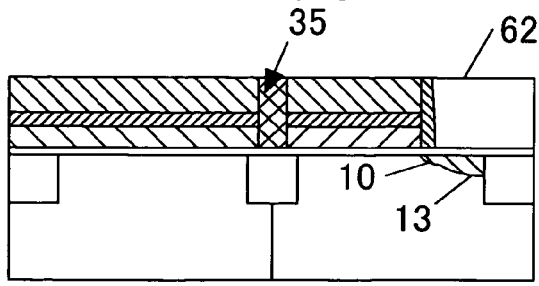

Then, titanium nitride film 42 was deposited to be 100 nm thick by a sputter method, and a pattern was formed in this film to connect electrically the electrodes and wirings in both regions (FIG. 8C). In this embodiment, spacer 11s and oxide 62 were embedded in the gap between the electrode and wiring in both p-type and n-type regions, but the above-mentioned titanium nitride film 35 may be formed, without embedding these insulator films into the gap (FIG. 8D). In this case, the thickness of the silicon nitride film is preferably controlled to be greater than double the trench distance, thereby filling the gap with the film. Next, using again the CMP technique, the titanium nitride deposited on the flat part is removed, leaving it only in the trench.

Figure 9A:
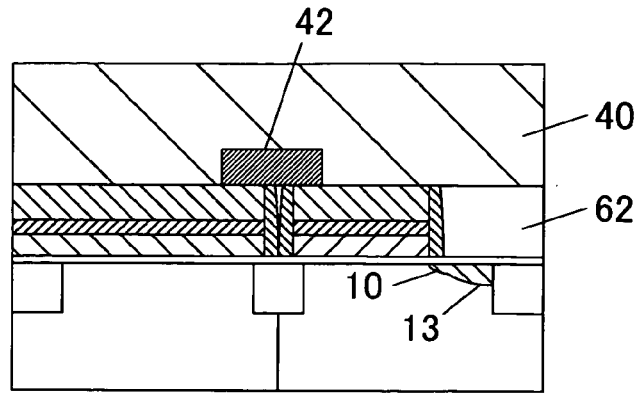
FIGS. 9A to 9C are schematic cross-sections of main parts of an application example in an embodiment, according to the second embodiment being an embodiment of this invention.
Figure 9B:
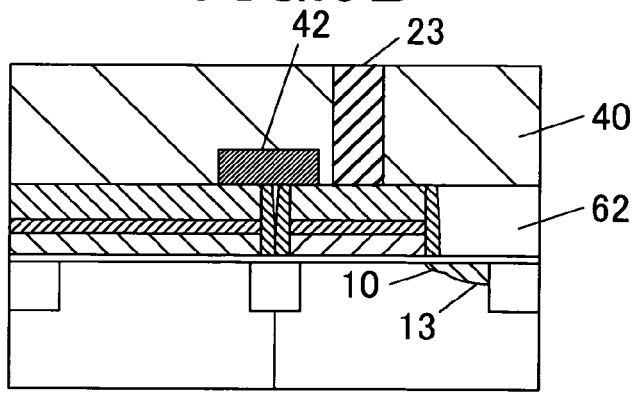
Figure 9C:
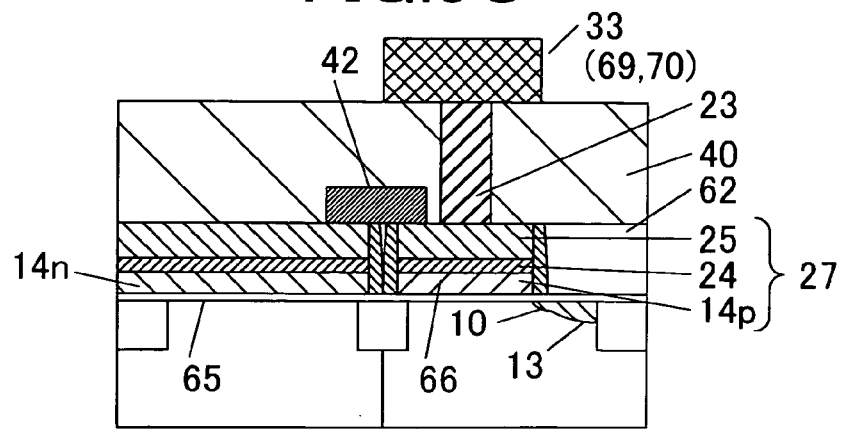

After the steps above-described, a silicon oxide film, which would be the insulating interlayer 40, was deposited again to be 100 nm in thickness at 420° C. (FIG. 9A) Subsequently, in order to make an electrical contact, the contact hole is opened in the above-mentioned silicon film using a dry-etching method and contact plug 23 comprising a complex of Ti/TiN/W is formed, which is used in a conventional semiconductor device (FIG. 9B). Moreover, wiring 33 comprising a laminate structure of W film 69 deposited by a sputter method and a W film deposited by a CVD method was formed on the insulating interlayer 40 (FIG. 9C).

Then, as described in first embodiment, heat-treatment was carried out in a condition which includes a range of thermal process conditions employed in a manufacturing process of a memory logic embedded semiconductor device. The process for removing the insulator at the pad part to make measurement taps was the same as that described in FIRST EMBODIMENT. In this embodiment, titanium nitride 42 was used as a bonding metal for the gate electrode and wiring at the above-mentioned boundary region, but other materials such as zirconium nitride, hafnium nitride, tantalum nitride, carbides of these metals, and conductive metal oxides may be used for the purpose of this invention which inhibits the mutual-diffusion of impurity elements such as phosphorus and boron to maintain conductivity between both regions. Moreover, a metallic film of tungsten or molybdenum may be laminated on the top of the above-mentioned titanium nitride 42, zirconium nitride, hafnium nitride, and tantalum nitride film.

According to this embodiment, space for matching the mask for the contact hole and the upper connecting wiring is not necessary as described above, therefore a high integration of the semiconductor device can be achieved.

The effects of impurity mutual-diffusion protection provided by this embodiment will be shown in the experimental data described later.

In this embodiment, the silicon oxide film 62 is embedded in the gap of the boundary region of the gate electrodes and wirings, comprising gate electrode and wiring with p-type silicon film 14p and those with n-type silicon film 14n. However, other insulators such as silicon nitride and alumina may be used for the embedded material. In this case, it may be necessary to change the processes related to manufacturing the gate electrode.

THIRD EMBODIMENT

Figure 10A:
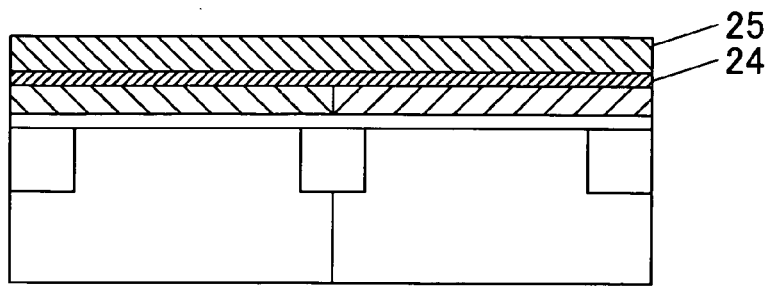
FIGS. 10A to 10C are schematic cross-sectional views of main parts of each process step illustrating a manufacturing process according to the third embodiment being an embodiment of this invention.
Figure 10B:
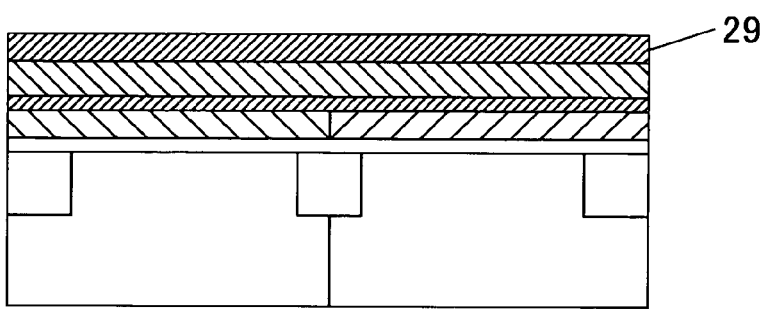
Figure 10C:
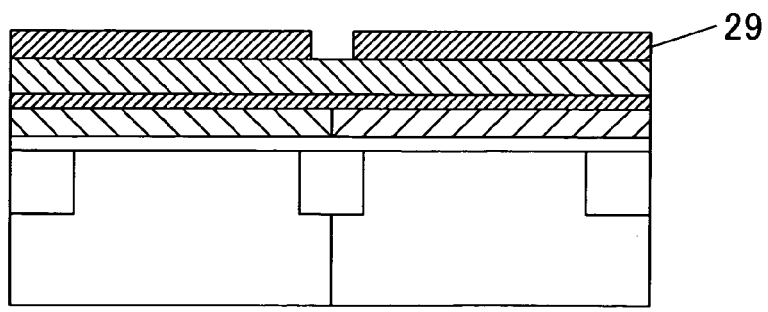

This embodiment will be described with reference to FIG. 10. In this figure, only the steps particularly relating to this embodiment are described. The steps from FIGS. 10A to 10G describe formation of isolation trench 2, formation of p-type well 3 and n-type well 4, formation of gate electrode, formation of silicon films of n-type silicon film 14n and p-type silicon film 14p, formation of $WN_x$ film 24 and W film 25 (FIG. 10A), formation of silicon nitride film 29 (FIG. 10B), and patterning the silicon nitride 29 by photolithography (FIG. 10C). In the first embodiment, the silicon nitride film 29 located at the boundary connecting n-type impurity and p-type impurity regions of the amorphous silicon film, is processed to make patterns, and then, using the patterned silicon nitride 29 as a dry-etching mask, $WN_x$ film 24 and W film 25 of this region are removed.

Figure 11A:
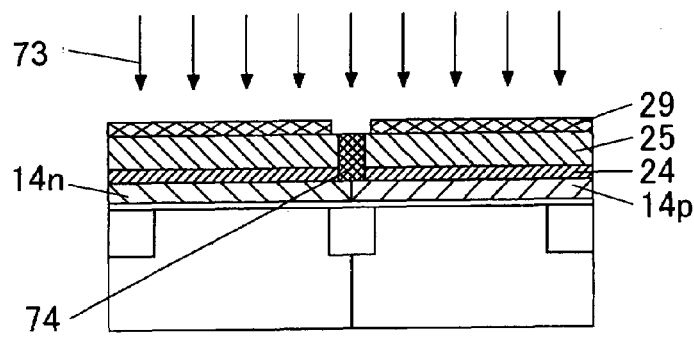
FIGS. 11A to 11D are schematic cross-sectional views of main parts of each process step illustrating a manufacturing process according to the third embodiment being an embodiment of this invention.
Figure 11B:
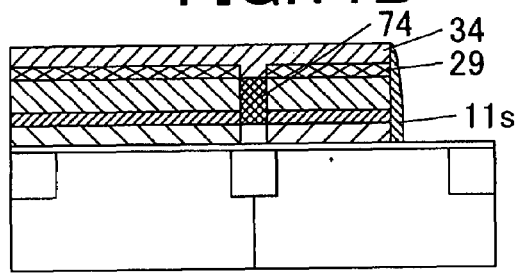
Figure 11C:
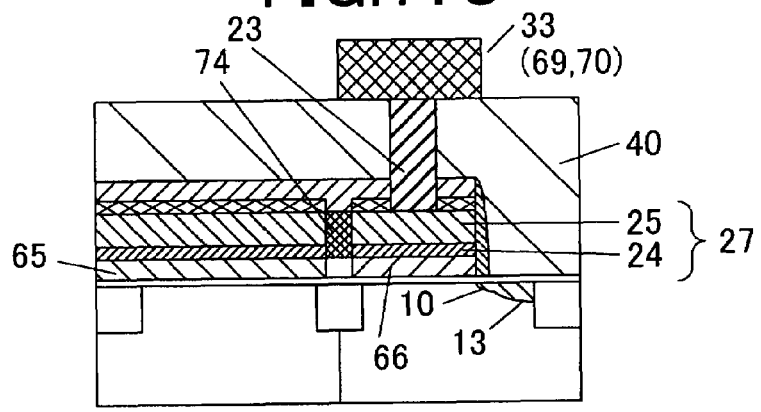
Figure 11D:
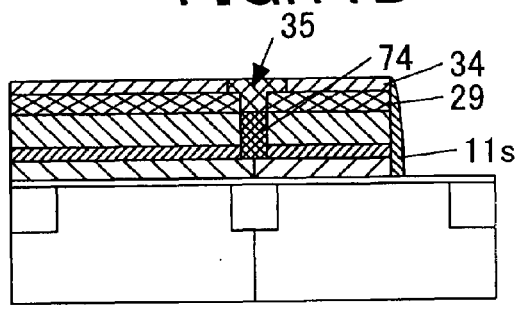
Figure 22B:
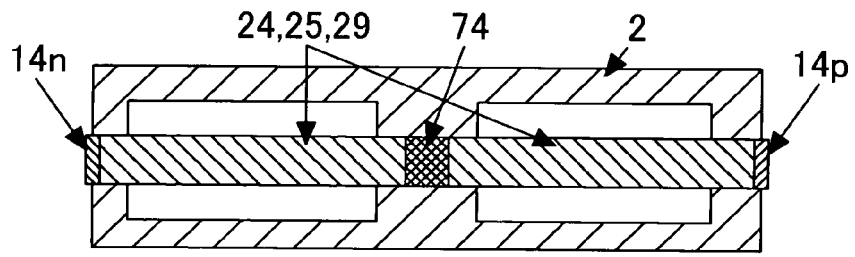

In this embodiment, carbon 73 is doped in the W film 25 and $WN_x$ film 24 by an ion implantation technique using the silicon nitride film 29 as a mask except for removing the W film 25 and $WN_x$ film 24. The carbon implantation was carried out with dosage of $1.\times 10^{16}/cm^2$ at 5 keV. By heat-treatment in nitrogen atmosphere at 650.degree. C. for 10 minutes, the area of ion implanted W film 25 and $WN_x$ film 24 changed into metal carbide 74 (FIG. 11A). After that, silicon nitride film 34 was deposited to be 120 nm in thickness by a plasma CVD method and, using this film, W film 25 and $WN_x$ film 24 and n-type silicon film 14n and p-type silicon film 14p were processed to make the gate electrode and wiring pattern. The side wall spacer 11s was formed along the wall of the gate electrode similar to the gate (FIG. 11B) described in the first embodiment, and a silicon oxide film is deposited to make the insulating interlayer 40. Subsequently, the contact plug 23 consisting of a complex of Ti/TiN/W is formed, and then wiring 33 comprising a laminate structure of a. W film 69 deposited by a sputter method and a W film deposited by a CVD method was formed on the insulating interlayer 40 (FIG. 11C). Titanium nitride 35 may be used to connect W film 25 and $WN_x$ film 24 isolated by the metal carbide 74 (FIG. 1D). The top plan view is shown in FIG. 22B.

In this embodiment, the effects of inhibiting the impurity mutual-diffusion can be obtained by forming tungsten carbide by post-annealing the region, which includes the carbon ions implanted into the W film 25 and $WN_x$ film 24. Moreover, diffusion may be stopped by making a tungsten nitride with high nitrogen concentration or tungsten oxide using ion implantation of nitrogen or oxygen, in lieu of carbon. The test results will be described later with the results of other embodiments.

FOURTH EMBODIMENT

Figure 12A:
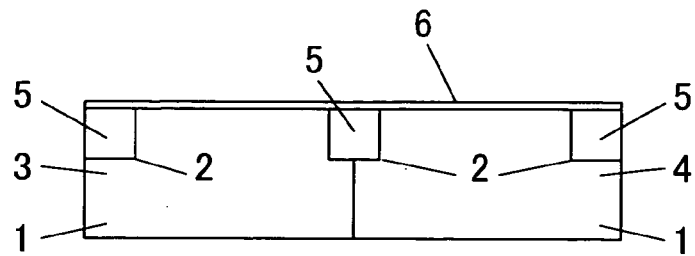
FIGS. 12A to 12E are schematic cross-sectional views of main parts of each process step illustrating a manufacturing process according to the fourth embodiment being an embodiment of this invention.
Figure 12B:
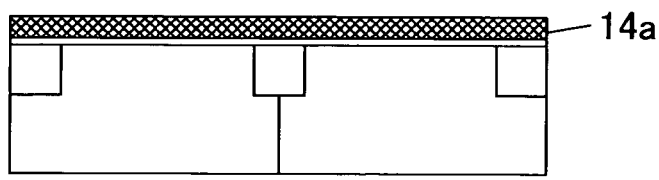
Figure 12C:
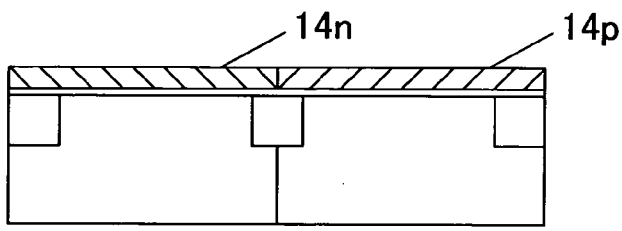
Figure 12D:
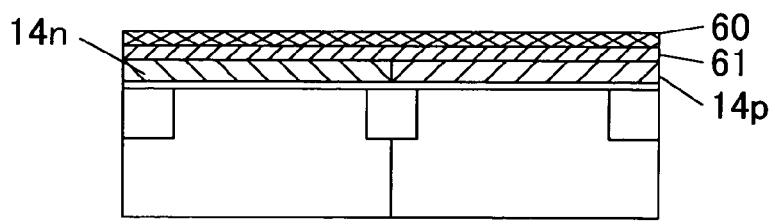
Figure 12E:
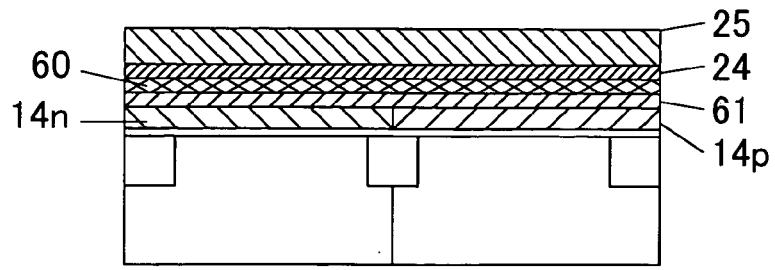
Figure 13A:
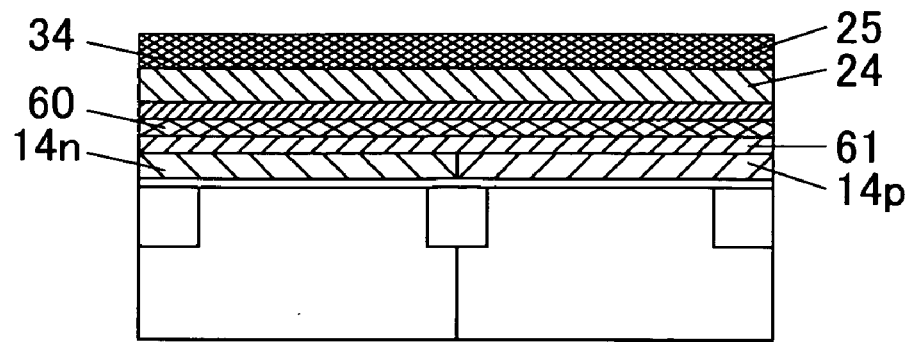
FIGS. 13A to 13B are schematic cross-sectional views of main parts of each process step illustrating a manufacturing process according to the fourth embodiment being an embodiment of this invention.

This embodiment will be described with reference to FIG. 12. In this embodiment, the $WN_x$ film 24, W film 25 and amorphous silicon film 14n and 14p located at the boundary of n-type and p-type regions of silicon is not isolated like the first and second embodiments. As described in the first embodiment, after the steps of forming the gate insulator 6 (FIG. 12A), forming the amorphous silicon film (FIG. 12B), and doping each impurity into the regions of amorphous silicon film 14n and 14P using an ion implantation method, the device was heat-treated in nitrogen atmosphere at 950° C. for 10 seconds to convert amorphous silicon into polycrystalline silicon (FIG. 12C). Next, the substrate silicon film 14na and 14p was exposed to a wet oxidizing atmosphere at 500° C. for 10 seconds to form the oxygen absorbed layer 61 on the surface. Subsequently, non-doped amorphous silicon film 60 is deposited to be 20 nm in thickness by the same process as described in the first and second embodiments (FIG. 12D). After depositing $WN_x$ film 24, W film 25 (FIG. 12E) and the silicon nitride film 34 (FIG. 13A), the silicon nitride film 34 was processed to have a desired pattern.

Figure 13B:
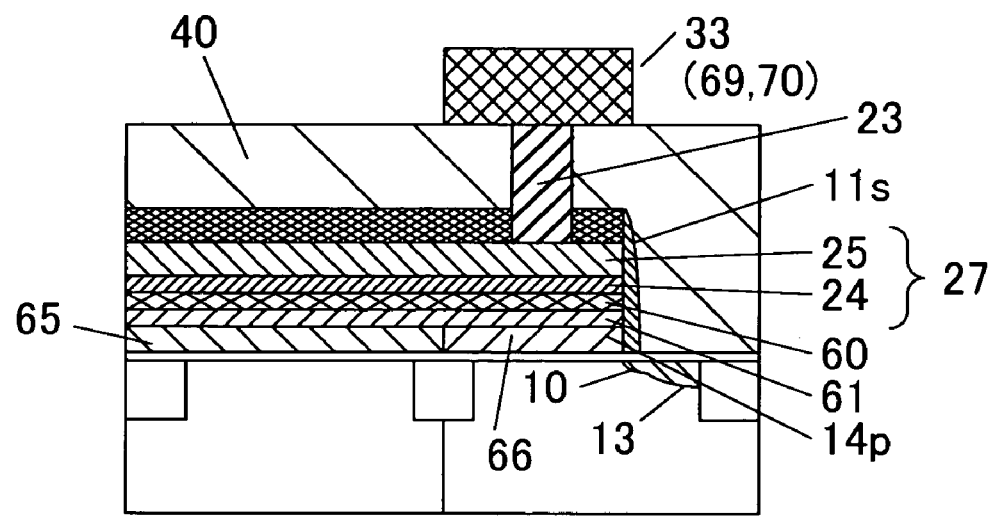
Figure 14:
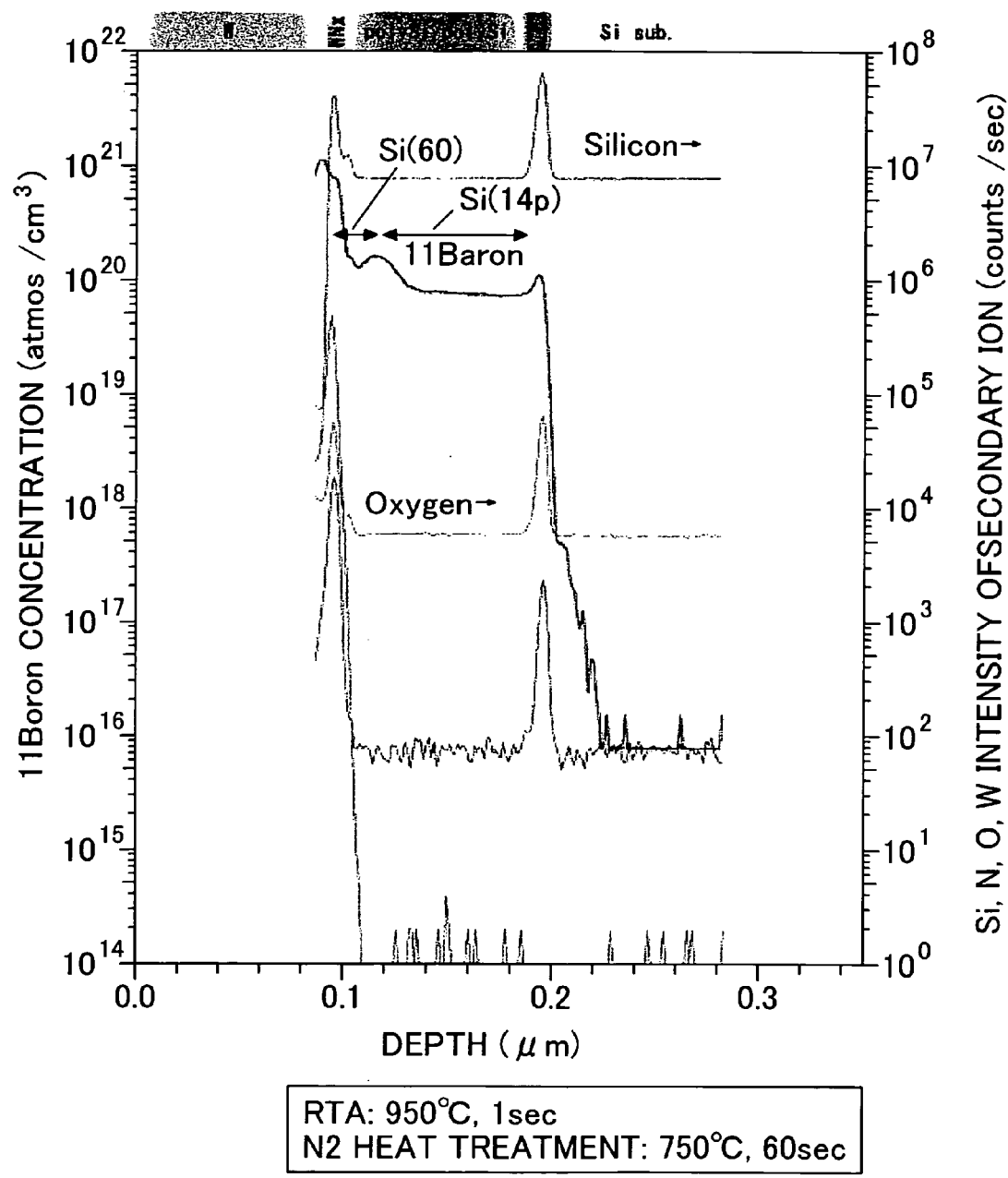
FIG. 14 are results of secondary ion mass spectrometry measurements relating to distribution of impurities along the depth of gate electrode and wiring film manufactured by FOURTH EMBODIMENT being an embodiment of this invention.

Using the patterned silicon nitride film 34 as a mask for dry-etching, the $WN_x$ film 24, W film 25, amorphous silicon film 60, and doped polycrystalline silicone 14n and 14p are processed to have the shapes of gate electrode and wiring. In this experiment, after depositing the silicon oxide film as the insulating interlayer 40 with the condition described in the first embodiment, the contact plug 23 consisting of a complex of Ti/TiN/W was formed, and then wiring 33 comprising a laminate structure of W film 69 deposited by a sputter method and W film deposited by a CVD method was formed on the insulating interlayer 40 (FIG. 13B).

Figure 22C:
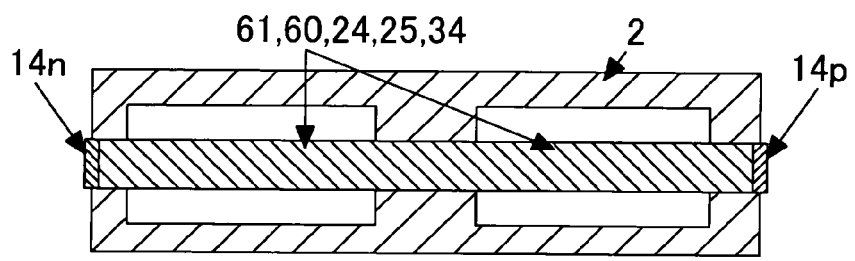

The top plan view is shown in FIG. 22C. After these steps, heat-treatment was carried out to evaluate the mutual-diffusion like the first to third embodiments.

The oxygen adsorbed layer 61 and the surface amorphous silicon 60 is effective in delaying the diffusion of phosphorus and boron contained in the silicon film 14n and 14p into the upper $WN_x$ film 24 and W film 25 during the post-annealing. Forming the carbon adsorbed layer 61 on the surface may provide the same effect, wherein the adsorbed layer is formed by exposing the surface of silicon film 14n and 14p to a gas atmosphere containing carbon such as alcohol at 600° C. for 20 seconds. Additionally, the same effect may be provided by forming a nitrogen adsorbed layer by exposing the surface to ammonia plasma at 480° C.

The contact resistance between a metallic layer and a silicon layer depends on the impurity concentration in the silicon layer. Therefore, in the structure described in the example, there was a concern that the impurity concentration in the silicon layer at the interface of the WNx film 24 and Si layer 60 is low. However, according to the results of secondary iron mass spectrometry, analyzing the distribution of the impurities along the depth of the gate electrode and wiring layer in the structure, for example, of W (25)/$WN_x$ (24)/Si (60)/poly-Si (14p), it was found that the boron concentration at the interface of $WN_x$ film 24 and Si layer 60 after a heat-treatment for manufacturing an embedded semiconductor device reached $5(1019/cm^3$, which was necessary to obtain an ohmic contact.

In lieu of the above-mentioned amorphous silicon 60, a silicon film including Ge (germanium) from 5% to a maximum of 50% may be acceptable.

In the case when Ge was added, there is an advantage that the contact resistance of the upper layer $WN_x$ film 24 and Si film 60 becomes lower because the band gap of silicon becomes narrower and the solubility limit of impurities becomes higher. The way to add Ge in silicon may be selected from Ge ion implantation into the silicon film and deposition of a Ge-containing silicon film by a CVD method using monosilane ($SiH_4$) and $GeH_4$.

FIFTH EMBODIMENT

Figure 15A:
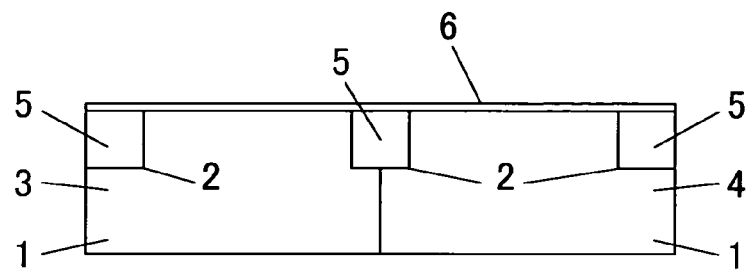
FIGS. 15A to 15D are schematic cross-sectional views of main parts of each process step illustrating a manufacturing process according to the fifth embodiment being an embodiment of this invention.
Figure 15B:
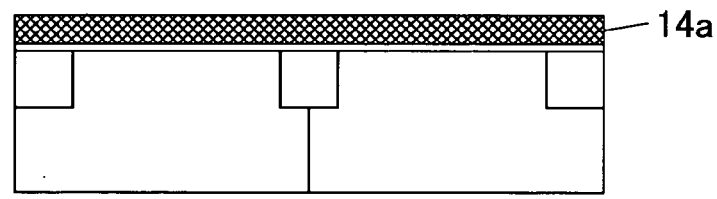
Figure 15C:
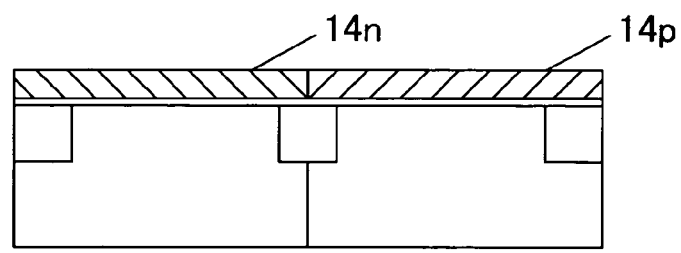
Figure 15D:
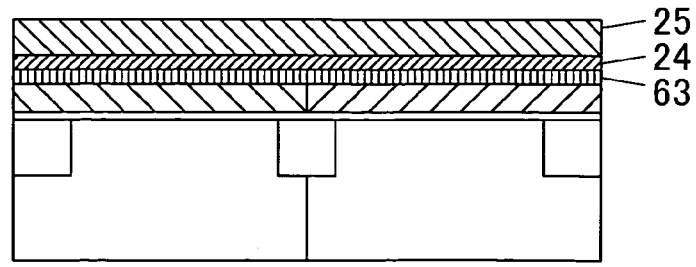

In this embodiment, as described in first embodiment, after the steps of forming the gate insulator 6 (FIG. 15A), forming the amorphous silicon film (FIG. 15B), and doping each impurity into the regions of amorphous silicon film 14n and 14P using an ion implantation method, the device was heat-treated in nitrogen atmosphere at 950° C. for 10 seconds to convert amorphous silicon into polycrystalline silicon (FIG. 15C). Then the tungsten silicide ($WSi_x$) film 63 with 10 nm thickness was deposited by a CVD method using $WF_6$ gas and $SiH_4$ gas at, for example, 630° C. Subsequently, about 7 nm thick $WN_x$ film 24 and about 70 nm thick W film 25 were deposited on the top of the $WSi_x$ film using a sputtering method (FIG. 15D).

Figure 16A:
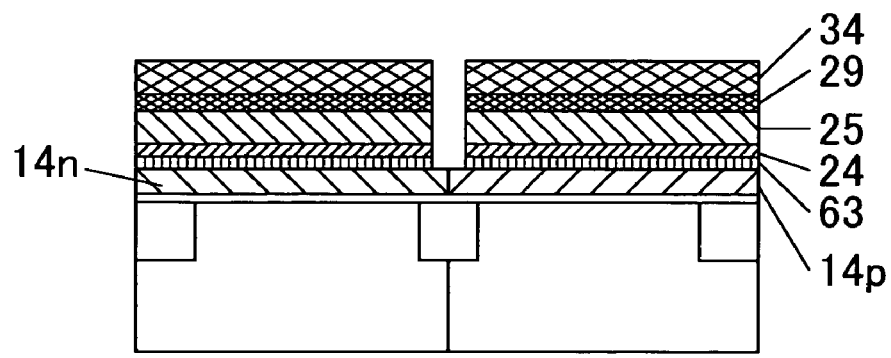
FIGS. 16A to 16D are schematic-cross-sectional views of main parts of each process step illustrating a manufacturing process according to the fifth embodiment being an embodiment of this invention.

The silicon nitride film 29 was deposited on the top of the W film 25 using a plasma CVD method and the silicon nitride film 29 on the boundary connecting n-type impurity 14n and p-type impurity 14p regions is locally removed by a conventional photolithography technique and a dry-etching technique. Using the silicon nitride 29 as a dry-etching mask, $WN_x$ film 24, W film 25, and $WSi_x$ film 63 were removed on the connecting region of n-type impurity 14n and p-type impurity 14p (FIG. 16A).

The silicon nitride film 34 is again deposited using a CVD method and processed into a desired pattern. Then, using the silicon nitride 34 as a mask, W film 25, $WN_x$ film 24, $WSi_x$ film 63, silicon film 14n and 14p are dry-etched to form the patterns of gate electrode and wiring.

Figure 16B:
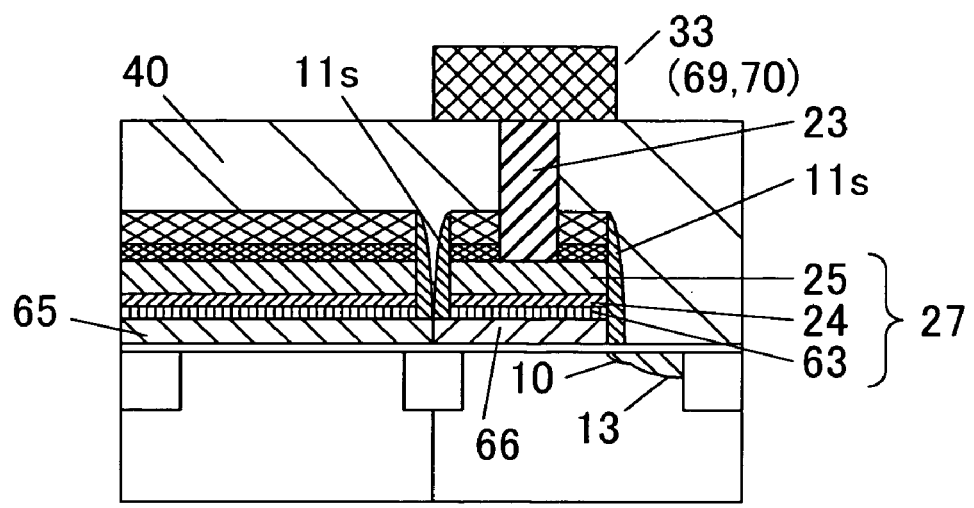
Figure 16C:
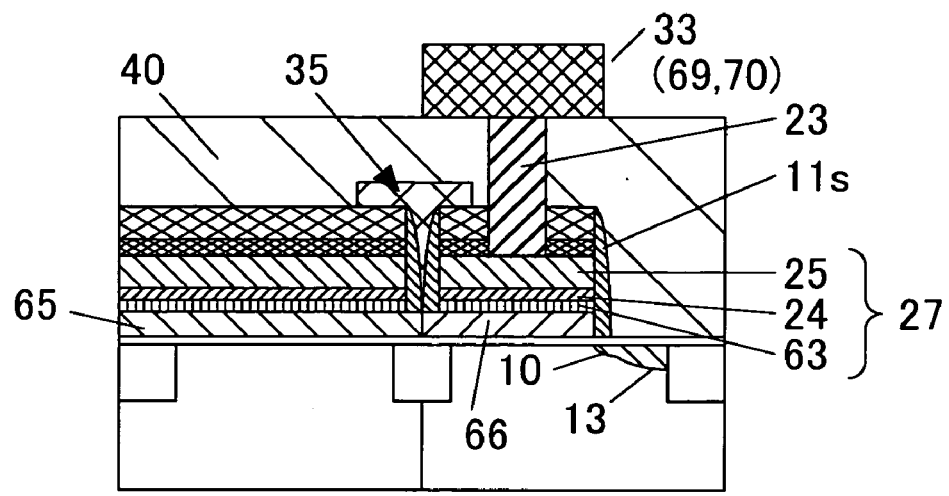
Figure 16D:
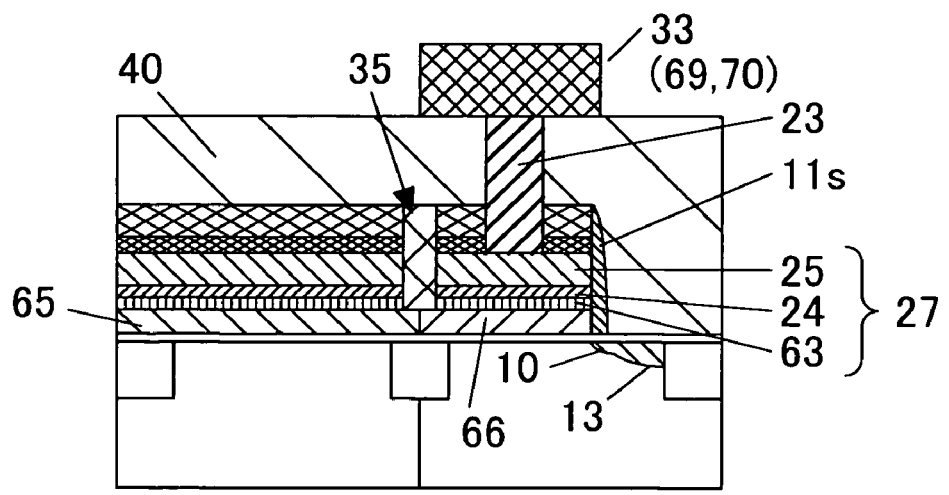
Figure 22D:
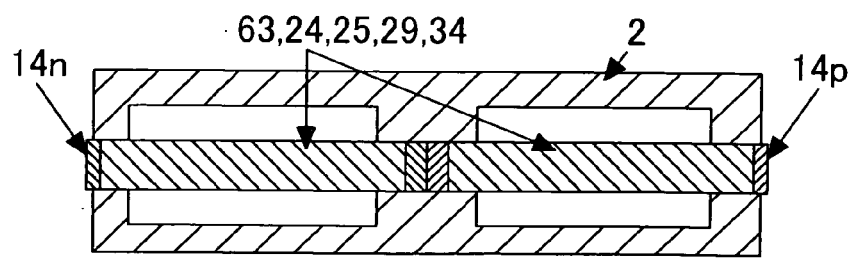

Subsequently, a silicon nitride film is deposited by a plasma CVD method, and the side-wall spacer 11s is deposited along the side wall of the gate electrode, the pattern of which is formed by etching the silicon nitride film using an anisotropic plasma etching technique. After the heat-treatment, a silicon oxide film is deposited as the insulating interlayer 40 by a CVD method, and it is filled with a Ti/TiN/W complex to form the contact plug 23. Moreover, wiring 33 comprising multi-layer structure of the W film 69 formed by a sputtering method and the W film 70 formed by a CVD method is deposited on the insulating interlayer 40 (FIG. 16B) Titanium nitride film 35 may be deposited on the side wall spacer 11s to connect the isolated W film 25, $WN_x$ film 24, and $WSi_x$ film 63 (FIG. 16C). Additionally, titanium nitride 35 may be embedded into parts of isolated W film 25, $WN_x$ film 24, and $WSi_x$ film 63 to connect each other (FIG. 16D). The top plan view is shown in FIG. 22D.

$WSi_x$ film 63 is used to avoid increasing the contact resistance at the interface which appears in a structure, wherein the $WN_x$ film 24 directly contacts the silicon base film. In the case when this $WSi_x$ film 63 is not applied, the above-mentioned contact resistance had a relatively high value from $1\times10^{-5}\Omega\cdot cm$ to $1\times10^{-3}\Omega\cdot cm$. On the other hand, when the $WSi_x$ film 63 is formed between the $WN_x$ film 24 and the above-mentioned silicon base film, the contact resistance could be reduced to the range from $5\times10^{-7}\Omega\cdot cm$ to $5\times10^{-6}\Omega\cdot cm$. It goes without saying that the formation of the $WSi_x$ film 63 provides the same effects even it is applied to each embodiment except for the first embodiment.

SIXTH EMBODIMENT

In the above-described first to fifth embodiments, a low temperature plasma CVD method was used to deposit W film 25 and a silicon nitride film on top of it in order to make the thermal load minimum until a region for interrupting the diffusion path or region for diffusion protection was formed, which is a purpose of this invention. However, the silicon nitride films 29 and 34 formed by plasma CVD contain a great amount of hydrogen. In the gate electrode and wiring region in which p-type impurity boron is contained in the silicon film, it is known that hydrogen accelerates boron diffusion through the bottom gate insulator from the p-type silicon film to the silicon substrate of the channel region in a MISFET. On the other hand, a silicon nitride film deposited by a low pressure CVD method at a relatively high temperature of 700° C. or 800° C. contains much less hydrogen and has the characteristic of less external hydrogen diffusion.

In order to evaluate the boron leakage from this silicon nitride, the capacitor properties of the gate insulator 6 were measured. In this embodiment, similar to FIRST EMBODIMENT, after formation of gate insulator 6, silicon film 14n and 14p, $WN_x$ film 24, and W film 25, a 20 nm thick silicon nitride film 64 was formed by a low pressure CVD method. Subsequently, using the same condition described in the above embodiments, a MOS capacitor (FIG. 18B) comprising the silicon nitride film 29 or 34 formed by plasma CVD was manufactured. At the same time, a MOS capacitor made by a process shown in the first to fifth embodiments was also manufactured, wherein the silicon nitride film 64 was not formed by low pressure CVD, and then the deviations of flat band voltage ($V_{FB}$) of these capacitors were evaluated. It goes without saying that $V_{FB}$ corresponds to the threshold voltage of the MISFET.

Figure 17A:
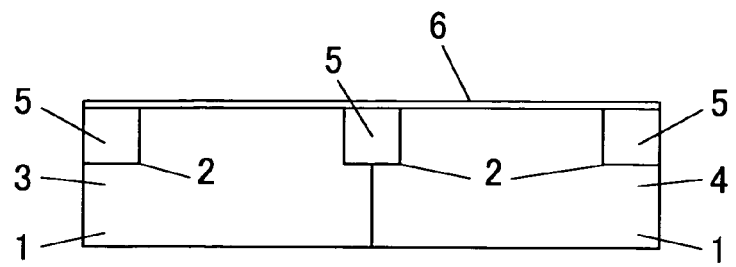
FIGS. 17A to 17D are schematic cross-sectional views of main parts of each process step illustrating a manufacturing process according to the sixth embodiment being an embodiment of this invention.
Figure 17B:
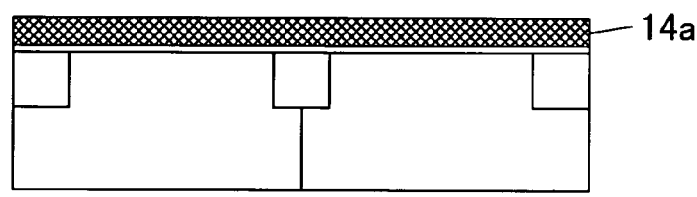
Figure 17C:
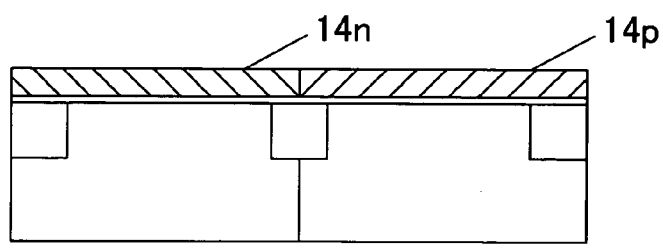
Figure 17D:
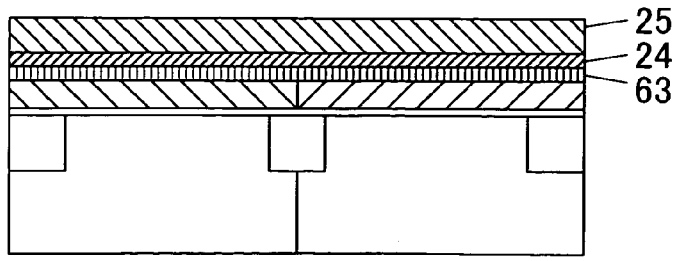
Figure 18A:
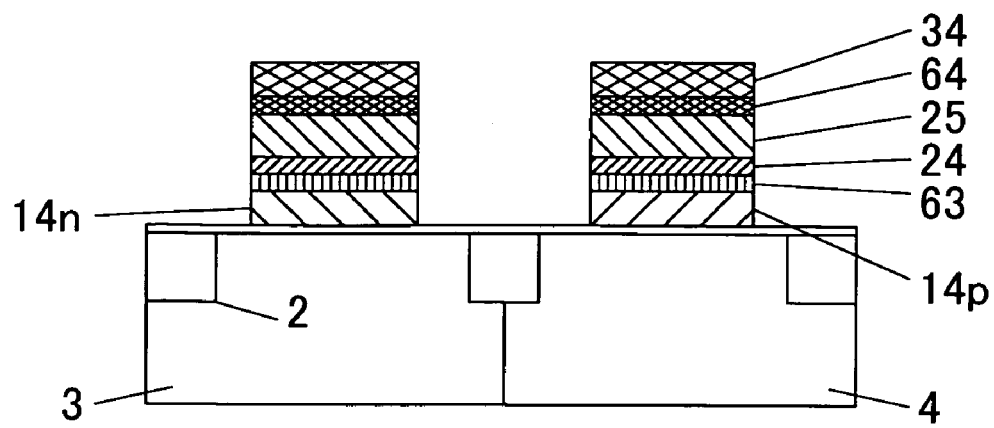
FIGS. 18A to 18B are schematic cross-sectional views of main parts of each process step illustrating a manufacturing process according to the sixth embodiment being an embodiment of this invention.

In this embodiment, after depositing 3.5 nm thick $SiO_2$ gate oxide film 6 on the n-type well 4 (FIG. 17A), amorphous silicon film 14a was formed (FIG. 17B), and then each impurity was doped into the amorphous silicon film 14n and 14p regions using an ion implantation technique. Subsequently, the film was heat treated in nitrogen atmosphere at 950° C. for 10 seconds to convert the amorphous silicon to polycrystalline silicon (FIG. 17C). Tungsten silicide ($WSi_x$) film 63 with 10 nm thickness is deposited at, for example, 630° C. by a CVD method using $WF_6$ and $SiH_4$ gases. On the silicide film, an approximately 7 nm thick $WN_x$ film and an approximately 70 nm thick W film 25 were deposited by a sputtering method (FIG. 17D). Then, the 20 nm thick silicon nitride film 64 was deposited by a low pressure CVD method at a relatively high temperature of 700° C. or 800° C., and the silicon nitride film 34 was deposited on it by a plasma CVD method. The silicon nitride films 34 and 64 were processed to form a desired pattern and, using these patterned silicon-nitride films 34 and 64 as a mask, the W film 25, $WN_x$ film 24, $WSi_x$ film 63, and silicon films 14n and 14p were dry-etched to form the gate electrode pattern (FIG. 18A).

Figure 18B:
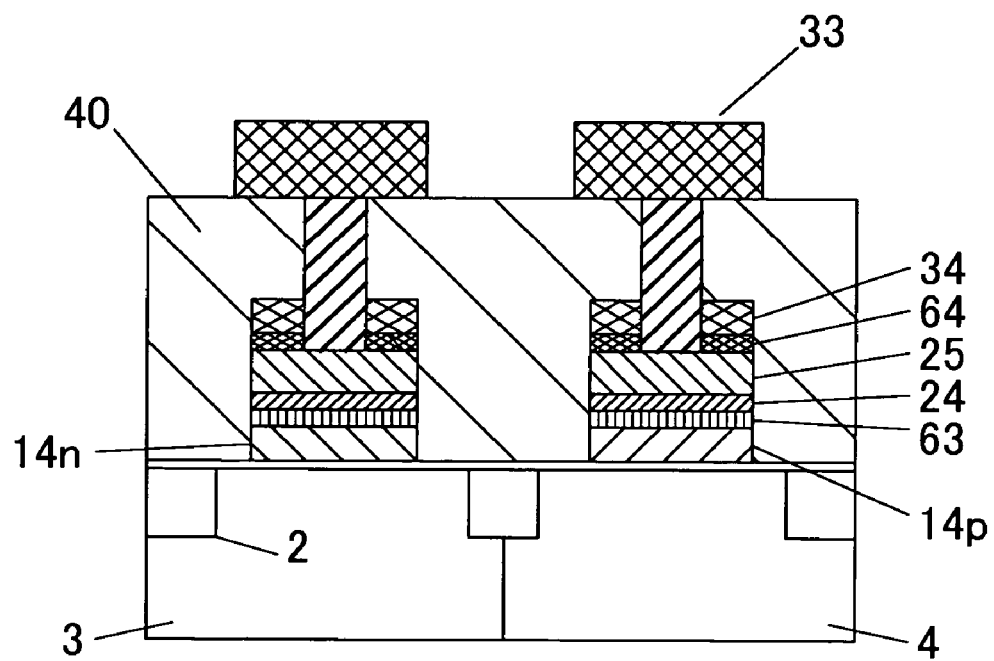

Then, after depositing the silicon oxide film by a CVD method as the insulating interlayer 40, the contact plug 23 consisting of a complex film of Ti/TiN/W is formed connecting the W film 25, and then wiring 33 was formed on the insulating interlayer 40 (FIG. 18B).

As shown in FIG. 18B, an MOS capacitor was formed in the p-well 3 but we omitted it because it was not related to the purpose of this embodiment. These MOS capacitors manufactured by the way descried above were heat-treated in nitrogen atmosphere from 600° C. to 1000° C. for 60 seconds.

Figure 19A:
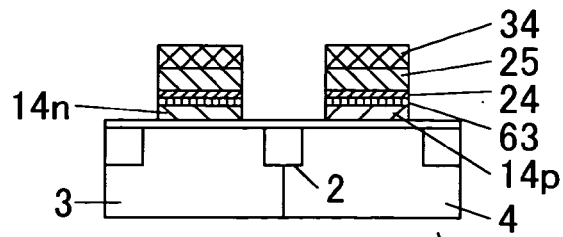
FIG. 19 is the relationship between flat band voltage ($V_{FB}$) deviation caused by boron leakage and heat-treatment temperatures in nitrogen for a MOS capacitor illustrating a manufacturing process according to the sixth embodiment being an embodiment of this invention.
Figure 19C:
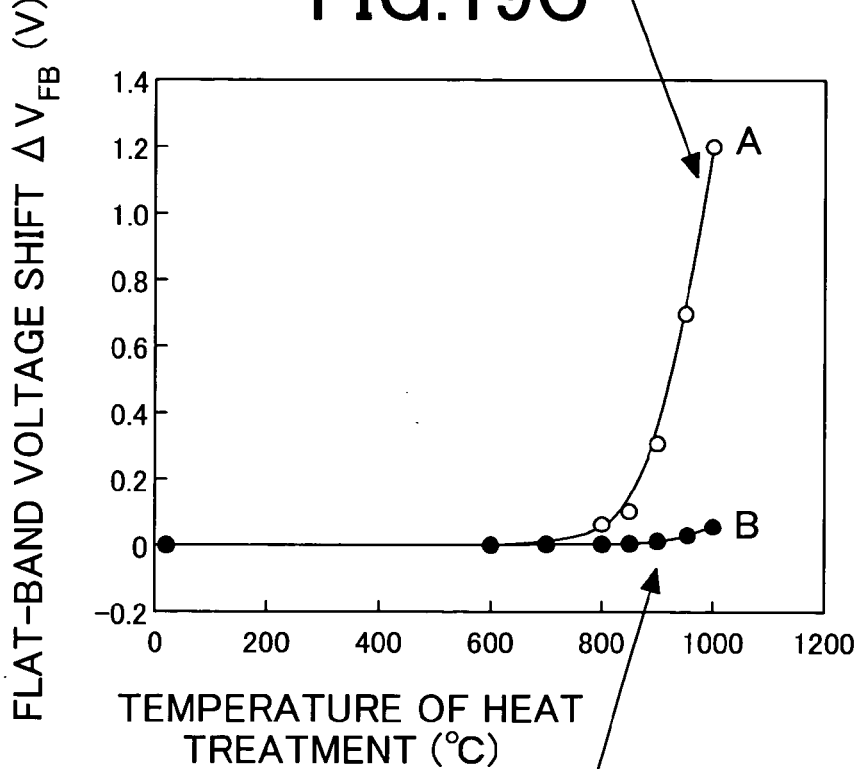

The measurement results of flat band voltage ($V_{FB}$) are shown in FIG. 19. FIG. 19A shows the structural drawing in the case when the silicon nitride film 34 was formed on W film 25 by a plasma CVD method without depositing the silicon nitride film 64 using a low pressure CVD method, and the flat band voltage ($V_{FB}$) characteristics are shown as the measured values (A) in FIG. 19C. In the capacitor not containing the low pressure CVD method silicon nitride film 64 with measured values (A) a deviation of the flat band voltage ($V_{FB}$) appeared due to heat-treatment and it became drastically greater above 900° C.

Figure 19B:
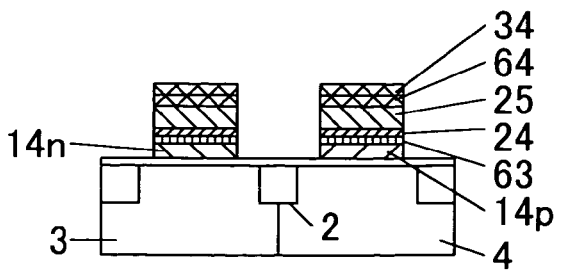

On the other hand, FIG. 19B shows the structural drawing in the case when the silicon nitride film 34 was formed on the silicon nitride film 64 after depositing the silicon nitride film 64 on the W film 25 by a low pressure CVD method, and the flat band voltage ($V_{FB}$) characteristics are shown as the measured values (B) in FIG. 19C. In the capacitor having the silicon nitride film 64 shown as measured values (B), deviation of $V_{FB}$ was drastically suppressed. The deviation of $V_{FB}$ by heat-treatment indicated that boron-leakage was accelerated by hydrogen contained in the film manufactured by a CVD method. FIG. 19 shows that, from the viewpoint of boron-leakage, the thermal load should be limited to be below 800° C. in the case when a low pressure CVD nitride film 64 is not applied.

In order to reduce the amount of boron-leakage, one might consider manufacturing all silicon nitride films deposited on the W film 25 by allow pressure CVD process. However, when such a thick silicon nitride film corresponding to the total film thickness is deposited by a low pressure CVD method, the gate electrode and wiring may experience a high temperature process for a long time.

Additionally, the step, wherein the silicon nitride film is formed, should be taken before the step applied in the above mentioned first to fifth embodiments for inhibiting or stopping mutual-diffusion of impurities. Therefore the mutual-diffusion of impurities due to a high temperature process in the low pressure CVD method occurs during the silicon nitride formation step using a low pressure CVD method.

Therefore, in the case of silicon nitride formation using a low pressure CVD method, it is necessary to control the thermal load at a level that allows an acceptable mutual-diffusion of impurities.

The silicon film 64 deposited by the low pressure CVD method applied in the above-mentioned MOS capacitor manufacturing is one considering this point.

The following describes the relationship between thermal load and increase in contact resistance due to mutual-diffusion of impurities, among the polycrystalline silicon films 14p and 14n and $WN_x$ film 24 or $WSi_x$ film 63 formed thereon. In the previous description of each example we did not explain the effects of $WSi_x$ film 63 on inhibiting or stopping the increase of the contact resistance caused by the mutual-diffusion through the $WN_x$ film 24 and W film 25. Following is a description of the contact resistance evaluation results from the device for analyzing impurity mutual-diffusion (FIG. 6) created in each example.

FIG. 20 shows the case where n-type impurity phosphorus exists in the silicon film as the diffusion source 65 and the contact resistance evaluation part consists of the silicon film 14p including p-type impurity boron, as shown in the figure. On the other hand, FIG. 21 shows the case where boron is included in the diffusion source region of silicon film 67 and the contact resistance evaluation area consists of the silicon film 14n including phosphorus. The horizontal axes of FIGS. 20 and 21 denote the distance between the contact resistance evaluation part 27 and diffusion source 28, that is, a lateral diffusion distance x of impurity through the $WN_x$ film 24, W film 25 or $WSi_x$ film 63 deposited on the silicon film, and the vertical axis is the increasing rate of contact resistance caused by the impurity mutual-diffusion. (The increasing rate is calculated by comparing with a device which had no diffusion source placed on the same chip, namely no impurity diffusion occurs in the device.)

Figure 20A:
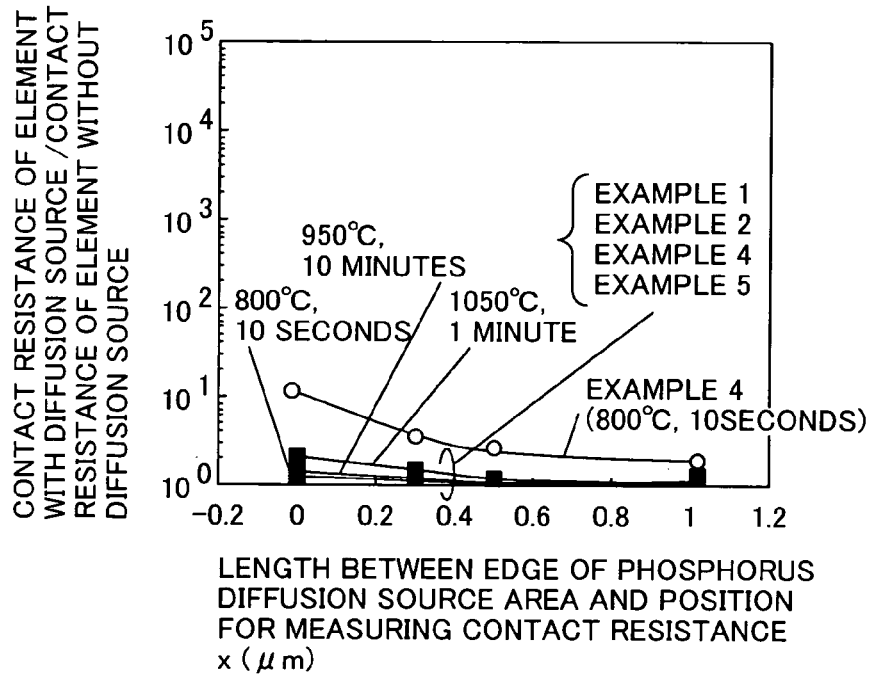
FIGS. 20A and 20B show relationships between diffusion-distances of phosphorus impurity and increasing rates in contact resistance with different thermal loads.
Figure 20B:
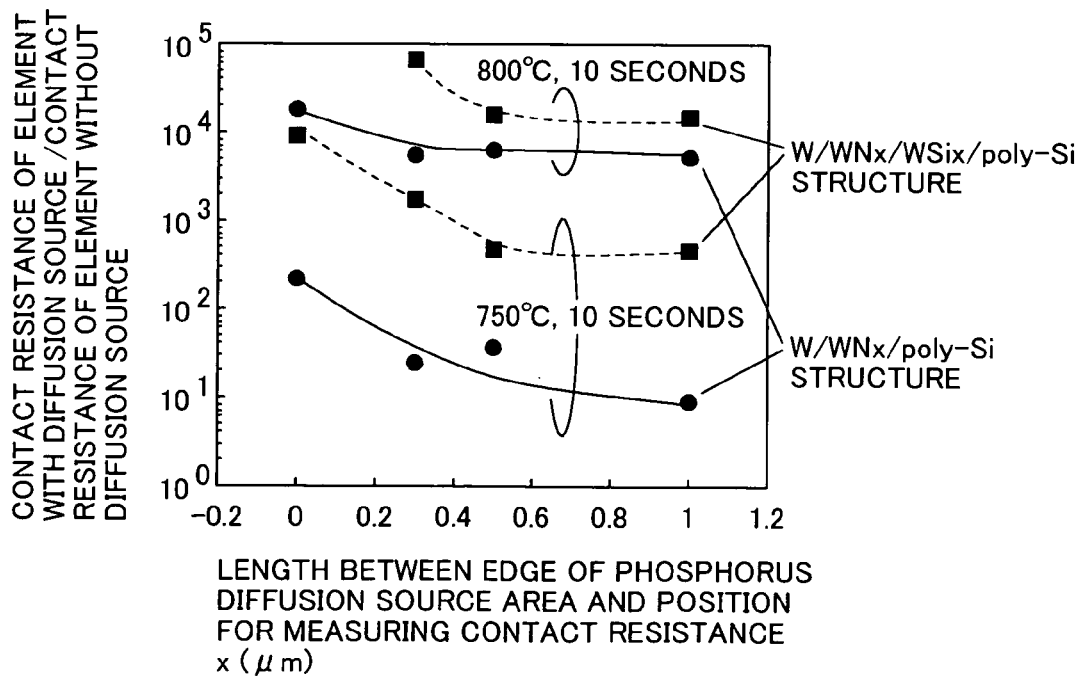
Figure 21A:
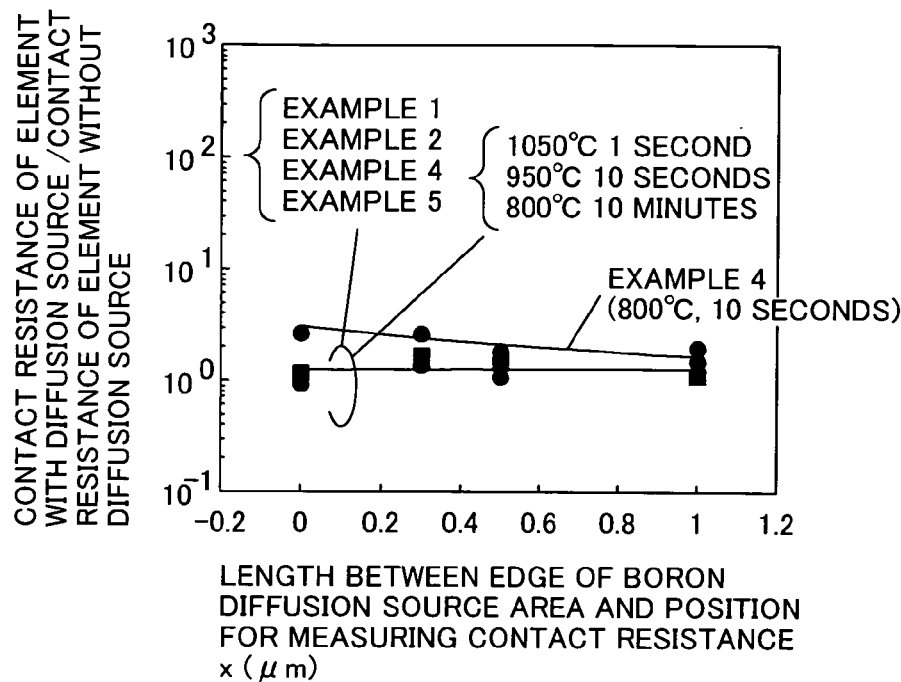
FIGS. 21A and 21B show relationships between diffusion-distances of boron impurity and increasing rates in contact resistance with different thermal loads.
Figure 21B:
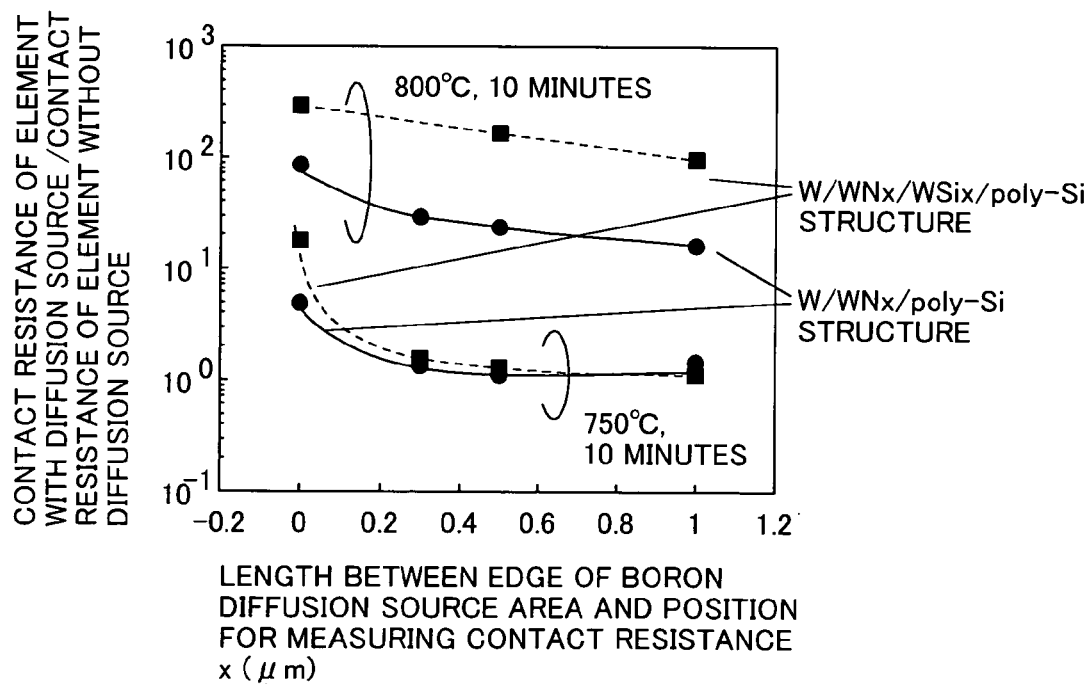

FIGS. 20A and 21B show the contact resistance test results of the devices, wherein the first to fifth embodiments were not applied. As shown in FIGS. 20A and 20B, in a conventional polymetal gate structure, wherein WSix film 63, WNx film 24 or W film 25 is deposited without isolating WSix film 63, WNx film 24 or W film 25 on the poly-silicon film comprising a connection of n-type and p-type impurities, a remarkable increase in the contact resistance caused by mutual-diffusion of impurities can be observed. FIG. 20B indicates that diffusion of phosphorus though a metal and metallic compound film is greater than that of boron.

In the laminate structure of W film 25/$WN_x$ film 24/silicon film, the heat treatment at 800° C. for approximately 10 minutes raises the increasing rate of contact resistance caused by phosphorus diffusion up about four orders of magnitude. When the heat-treatment temperature decreases to 750° C., the rate of increase comes down to one to two orders of magnitude. On the other hand, FIG. 21B indicates that the contact resistance becomes three orders of magnitude by heat-treatment at 800° C. in the case of boron. The increase in contact resistance caused by boron diffusion could not be observed when the heat treatment temperature decreased to 750° C.

Moreover, in the case of a laminate structure of W film 25/$WN_x$ film 24/$WSi_x$ film 63/silicon film, the contact resistance increased approximately half an order more in both cases. These increasing rates were almost the same as that of double layer poly-side gate consisting of a two-layer structure of $WSi_x$ film 63/silicon film In the chips manufactured this time, a device for analyzing impurity mutual-diffusion is provided which can measure the diffusion distance x from 0 μm to 1 μm. As FIGS. 20B and 21B indicated, it is clear that the diffusion distance reaches approximately 1 μm even in the heat-treatment process at 800° C. which is a relatively lower temperature.

It is necessary to make a device which has a longer diffusion distance x in order to calculate an accurate diffusion coefficient. Moreover, from a series of experiments shown in these FIGS., as patented in this invention, a heat-treatment process has to be controlled to be below 750° C. until a resistance or protection region is placed in an impurity dilution path in the gate electrode and wiring (until the laminate structured film is processed in the gate electrode and wiring pattern) In this condition the rate of increase of contact resistance caused by diffusion of impurities is about one order of magnitude, therefore it can be applied to a process for a semiconductor integrated circuit device where high-speed operation is demanded.

Next, the evaluation results of devices, wherein the first to fifth embodiments are applied, are shown in FIGS. 20A and 21A. It is indicated in each example that short duration anneal conditions from 950° C. for 10 seconds to 1050° C. for 1 second which are necessary for the manufacture of a semiconductor integrated circuit device can be endured.

Applying the following structures, we could realize a polymetal gate complementary MIS highly-integrated circuit device, wherein there is no problem of mutual-diffusion of impurities and boron leakage, and low contact resistance is ensured:

a structure as described in FOURTH EMBODIMENT, wherein a non-doped silicon layer or SiGe layer is deposited on a silicon layer comprising n-type impurity and p-type impurity regions, in order to delay the diffusion of impurities, a structure as described in the sixth embodiment, wherein a silicon nitride layer is deposited by a plasma CVD method on a silicon nitride layer formed by a low pressure CVD method on the W film 25, in order to stop boron leakage caused by hydrogen, a structure as described in the fifth embodiment, comprising a laminate structure of a W film 25/WNx film 24/WSix film 63/silicon film, in order to decrease the contact resistance, a structure as described in the first embodiment, wherein a W film 25/WNx film 24 are separated, in order to inhibit the mutual-diffusion of impurities, and a structure as described in the third embodiment, wherein a carbon, nitrogen or oxygen implantation technique is applied to the boundary of n-type impurity and p-type impurity regions in the W film 25/$WN_x$ film 24, in order to inhibit the mutual-diffusion of impurities.

The above has described this invention based on preferred embodiments created by inventors; however it is to be understood that the invention is not intended to be limited to the above-described embodiments and variations may be made by one skilled in the art without departing from the spirit and scope of the invention. For example, in SIXTH EMBODIMENT, the silicon nitride thin film 64 was deposited by a low pressure CVD method but other films may be used instead. As an example, one may be apply a plasma CVD method using nitrogen gas, in lieu of ammonia gas, to deposit a silicon nitride film. A higher temperature of 600° C. to 700° C. is necessary to deposit this film compared with a process using ammonia gas. However, lowering the processing temperature is more likely than a low pressure CVD method, and there is the advantage that total process thermal load applied to the gate electrode and wiring is small while depositing a silicon nitride film with a desired thickness. Therefore, this film also has an advantage in inhibiting diffusion of impurities. Moreover, this film contains less hydrogen similar to the one manufactured using ammonia gas, therefore it is useful to guard against leakage of boron.

The above-described embodiments illustrated the examples of DRAM, and DRAM embedded logic LSI, but it is to be understood that this invention is not intended to be limited to these LSI. This invention may be applied to an LSI comprising a MISFET wherein a gate electrode is formed by a conductive film with a polymetal structure, such as a CMOS logic LSI and a compact flash memory.

The effects provided by typical examples patented in present invention are briefly described as follows:

In a semiconductor integrated circuit device comprising a complementary MISFET having a polymetal structure, increase in the contact resistance of an interface of $WN_x$ film/polycrystalline silicon film caused by mutual-diffusion through $WN_x$ film/W film, which is located at a connecting region of a gate electrode and wiring region of p-type silicon film and a gate electrode and wiring region of n-type silicon film, can be inhibited.

What is claimed is:

1. A semiconductor integrated circuit device comprising:
   a first conductive type region and a second conductive type region formed in semiconductor substrate and separated by an isolation region;
   a gate insulator formed on said first conductive type region and said second conductive type region;
   a second conductive type silicon layer which is deposited over said first conductive type region and on said gate isolator, and a first conductive type silicon layer which is disposed over said second conductive type region and on said gate insulator, wherein a boundary between said first conductive type silicon layer and said second conductive type silicon layer is located over said isolation region;
   a first nitride film of refractory metal formed on said first conductive type silicon layer, and a second nitride film of refractory metal formed on said second conductive type silicon layer;
   a first refractory metal film formed on said first nitride film of refractory metal, and a second refractory metal film formed on said second nitride film of refractory metal; and
   a metal carbide formed between said first nitride film or refractory metal and said second nitride film of refractory metal, between said first refractory metal film and said second refractory metal film, and on said boundary between said first conductive type silicon layer and said second conductive type silicon layer.

2. A semiconductor integrated circuit device according to claim 1, wherein, instead of said metal carbide, a metal nitride with high nitrogen concentration or a metal oxide is formed between said first nitride film of refractory metal and said second nitride film of refractory metal, between said first refractory metal film and said second refractory metal film, and said boundary between said first conductive type silicon layer and said second conductive type silicon layer.

3. A semiconductor integrated circuit device according to claim 2, wherein a silicide film of refractory metal is formed between said first nitride film of refractory metal and said first conductive type silicon layer and between said second nitride film of refractory metal and said second conductive type silicon layers.

4. A semiconductor integrated circuit device according to claim 1, wherein a first silicide film of refractory metal is formed between said first and second nitride films of refractory metal and said first conductive and second conductive silicon layers.

5. A semiconductor integrated circuit device according to claim 1, wherein a first silicide film of refractory metal is formed between said first nitride film of refractory metal and said first conductive type silicon layer, a second silicide film of refractory metal is formed between said second nitride film of refractory metal and said second conductive type silicon layer, and a non-doped silicon layer or a germanium-doped silicon layer is formed between said first silicide film of refractory metal and said first conductive type silicon layer and between said second silicide film of refractory metal and said second conductive type silicon layer.

6. A semiconductor integrated circuit device according to claim 1, wherein a non-doped silicon layer or germanium-doped silicon layer is formed between said first nitride film of refractory metal and said first conductive type silicon layer and between said second nitride film of refractory metal and said second conductive type silicon layers.

* * * * *